United States Patent
Poelzl et al.

(10) Patent No.: US 10,181,511 B2
(45) Date of Patent: Jan. 15, 2019

(54) SEMICONDUCTOR DEVICE AND METHOD OF MANUFACTURING A SEMICONDUCTOR DEVICE

(71) Applicant: Infineon Technologies Austria AG, Villach (AT)

(72) Inventors: Martin Poelzl, Ossiach (AT); Georg Ehrentraut, Villach (AT); Franz Hirler, Isen (DE); Maximilian Roesch, St. Magdalen (AT)

(73) Assignee: Infineon Technologies Austria AG, Villach (AT)

( * ) Notice: Subject to any disclaimer, the term of this patent is extended or adjusted under 35 U.S.C. 154(b) by 28 days.

(21) Appl. No.: 14/871,845

(22) Filed: Sep. 30, 2015

(65) Prior Publication Data

US 2016/0104797 A1  Apr. 14, 2016

(30) Foreign Application Priority Data

Oct. 13, 2014 (DE) .................. 10 2014 114 832

(51) Int. Cl.
*H01L 29/06* (2006.01)
*H01L 29/40* (2006.01)
*H01L 29/66* (2006.01)
*H01L 29/78* (2006.01)

(52) U.S. Cl.
CPC ........ *H01L 29/0696* (2013.01); *H01L 29/404* (2013.01); *H01L 29/407* (2013.01); *H01L 29/66734* (2013.01); *H01L 29/7813* (2013.01)

(58) Field of Classification Search
CPC ............. H01L 29/7813; H01L 29/0696; H01L 29/407; H01L 29/66734
See application file for complete search history.

(56) References Cited

U.S. PATENT DOCUMENTS 7,598,566 B2 * 10/2009 Hotta .................. H01L 29/0696
257/327
2010/0052044 A1 * 3/2010 Hirler ................. H01L 29/7813
257/328

FOREIGN PATENT DOCUMENTS

DE  102009035688 A1   4/2010

* cited by examiner

*Primary Examiner* — Amar Movva
(74) *Attorney, Agent, or Firm* — Murphy, Bilak & Homiller, PLLC

(57) ABSTRACT

A semiconductor device comprises a gate electrode in a trench in a semiconductor body. The gate electrode comprises a plurality of gate segments disposed along an extension direction of the trench, the gate segments being connected to neighboring gate segments by means of connection elements. A distance between adjacent gate segments is equal to or smaller than 0.5*L, wherein L denotes a length of each of the gate segments, the length being measured along the extension direction of the trench.

24 Claims, 23 Drawing Sheets

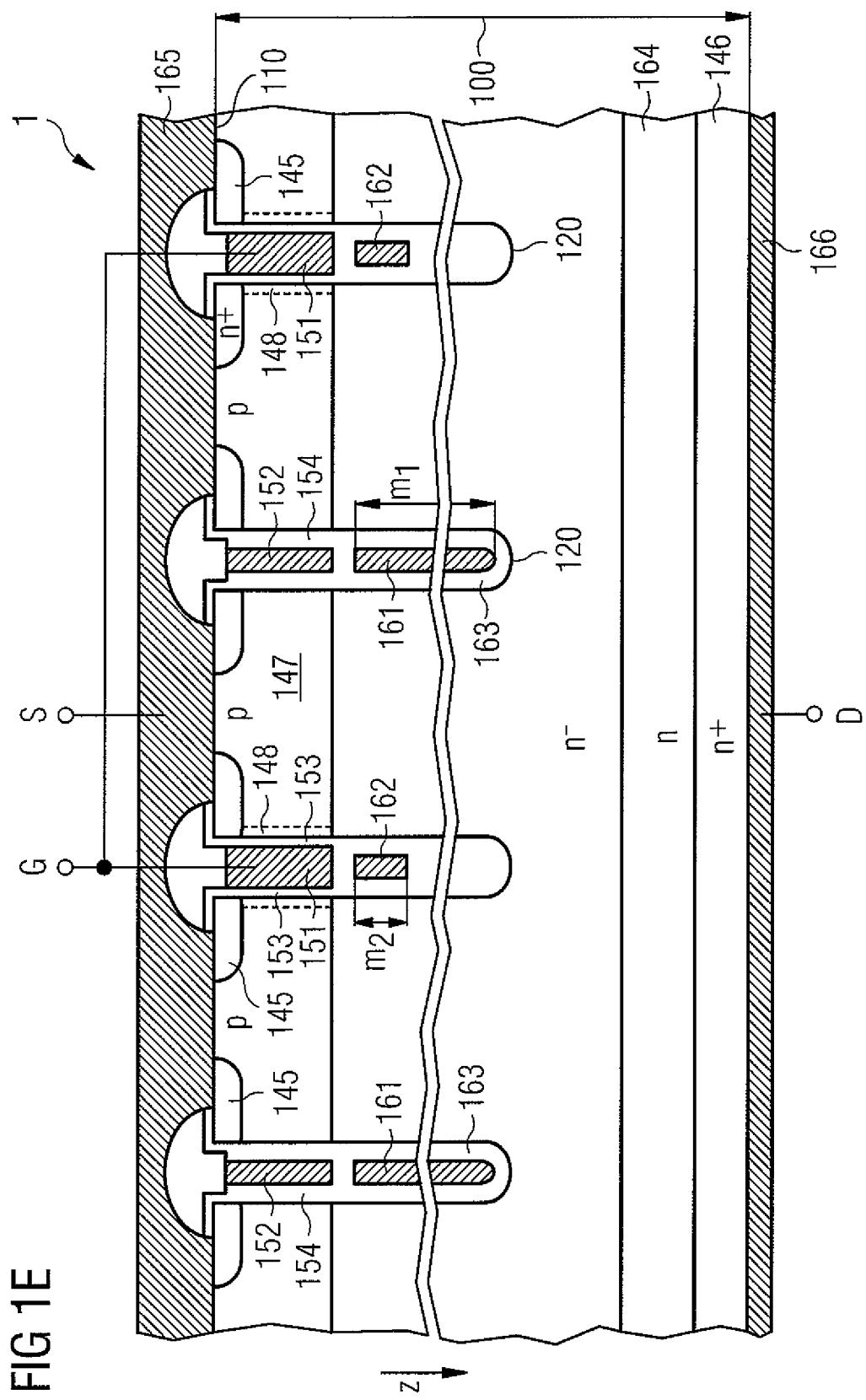

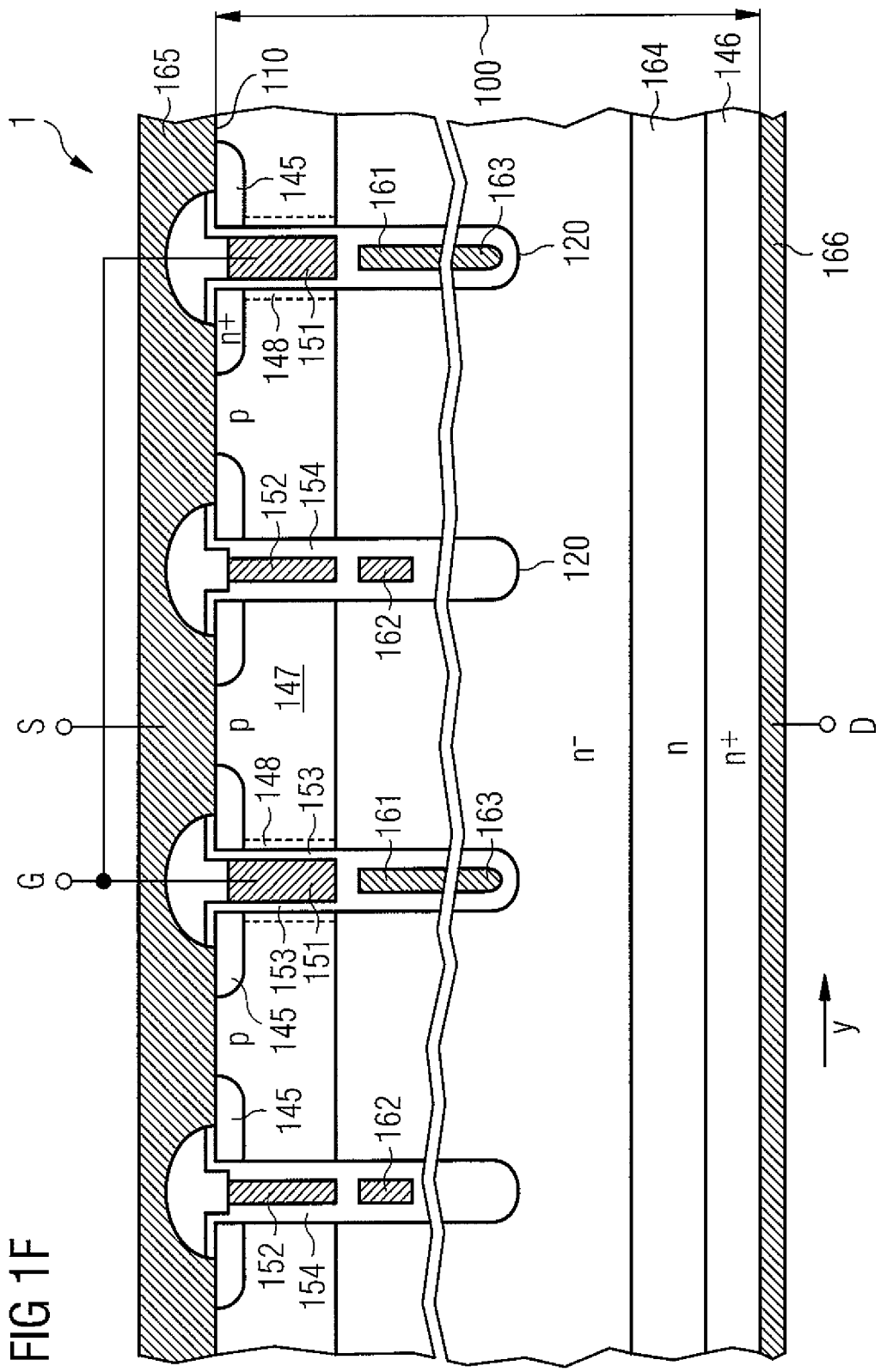

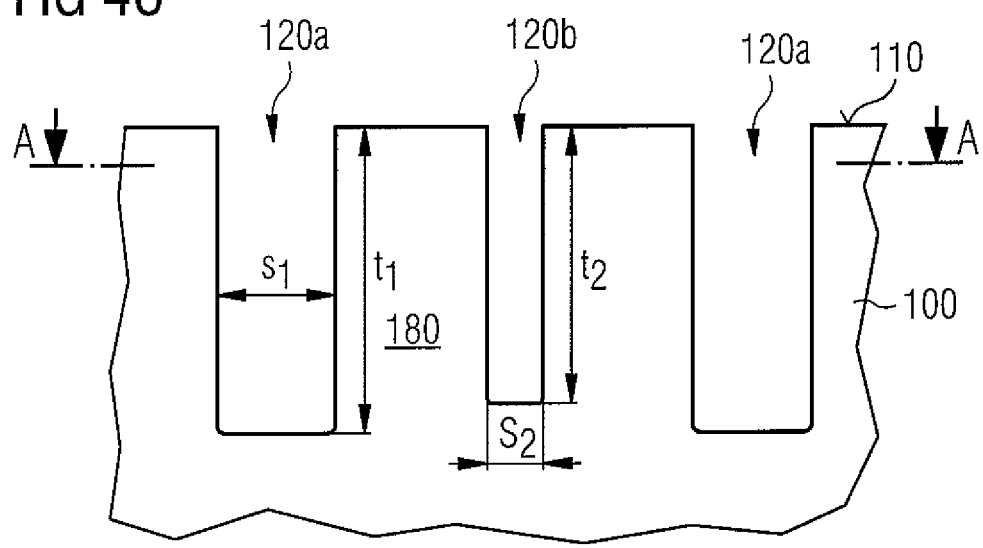
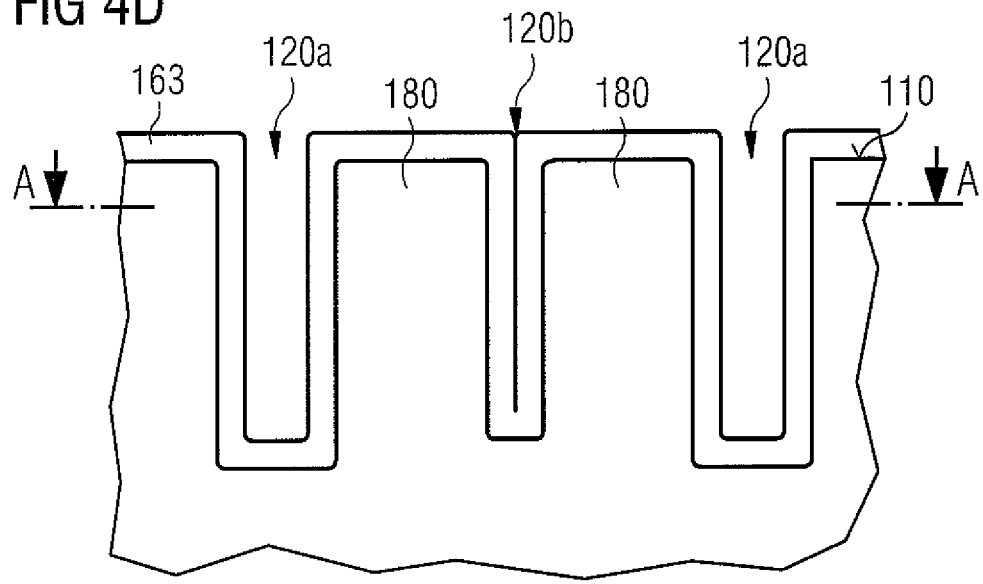

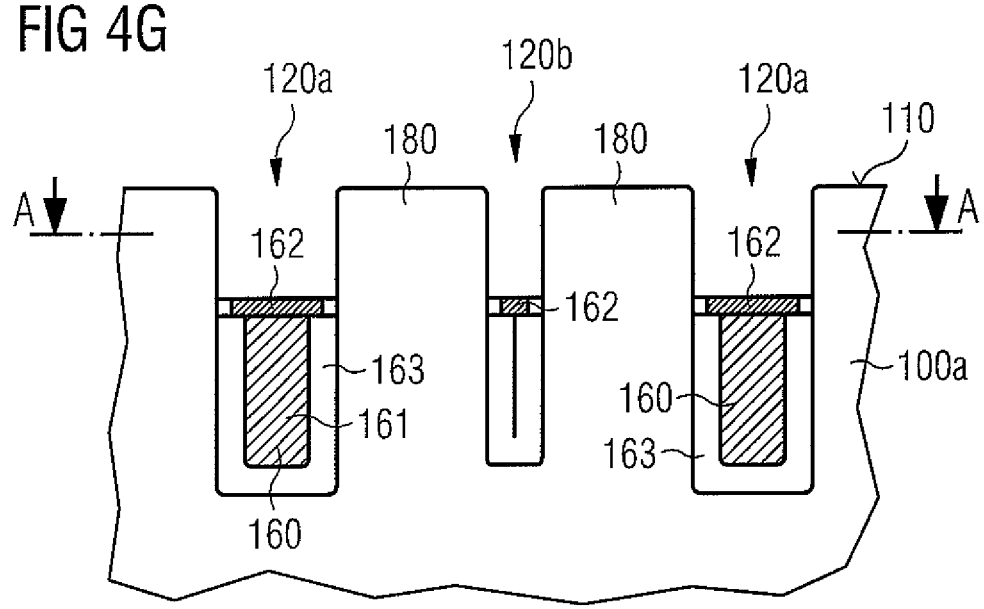
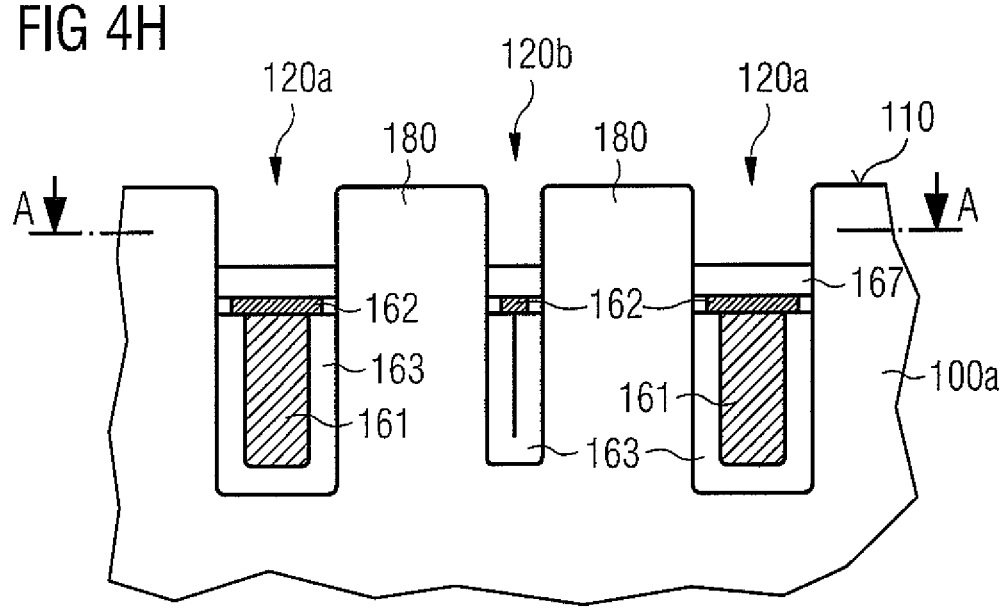

SEMICONDUCTOR DEVICE AND METHOD OF MANUFACTURING A SEMICONDUCTOR DEVICE

BACKGROUND

The present application claims priority under 35 USC § 119 to German (DE) Patent Application Serial No. DE 10 2014 114 832.0 filed on Oct. 13, 2014. The disclosure in this priority application is hereby incorporated fully by reference into the present application.

BACKGROUND ART

Power transistors commonly employed in automotive and industrial electronics require a low on-state resistance ($R_{on}$), while securing a high voltage blocking capability. Power transistors may be employed as switching elements in a variety of circuits, e.g. in converter circuits. In order to meet the demands of such converter circuits, the transistors should be able to be switched at high frequencies and at low charge and conduction losses. Hence, attempts are made to improve the performance of power transistors, in order to improve the efficiency of circuits.

SUMMARY

According to an embodiment, a semiconductor device comprises a gate electrode in a trench in a semiconductor body. The gate electrode comprises a plurality of gate segments disposed along an extension direction of the trench. The gate segments are connected to neighboring gate segments by means of connection elements. A distance between adjacent gate segments is equal to or smaller than 0.5*L, wherein L denotes a length of each of the gate segments, the length being measured along the extension direction of the trench.

According to a further embodiment, a semiconductor device comprises a gate electrode in a trench in a semiconductor body. The gate electrode comprises a plurality of gate segments disposed along an extension direction of the trench. The gate segments are electrically connected to neighboring gate segments by means of connection elements. The semiconductor device further comprises a source region disposed at a surface of the semiconductor body adjacent to the trench. The source region comprises a plurality of source segments separated from each other and disposed along the extension direction of the trench.

According to an embodiment, a semiconductor device comprises a gate electrode and a field plate, the gate electrode and the field plate being disposed in a trench formed in a semiconductor body. The field plate comprises a plurality of field plate segments disposed along an extension direction of the trench. The field plate segments are electrically connected to neighboring field plate segments by means of second connection elements.

According to an embodiment, a method of manufacturing a semiconductor device comprises forming a trench in a semiconductor body, and forming a plurality of gate segments in the trench. The gate segments are electrically connected to neighboring gate segments by connection elements so as to be disposed along an extension direction of the trench. A distance between neighboring gate segments is equal to or smaller than 0.5*l, wherein l denotes the length of each of the gate segments, the length being measured along the extension direction of the trench.

According to a further embodiment, a semiconductor device comprises a gate electrode disposed in a trench formed in a semiconductor body. The gate electrode comprises a plurality of gate segments disposed along an extension direction of the trench. The gate segments are electrically connected to neighboring gate segments by means of connection elements. The connection elements are made of a connection material that is different from a material of the gate segments, or a vertical depth of the connection elements is smaller than a depth of the gate segments.

According to an embodiment, a method of manufacturing a semiconductor device including a transistor comprises forming a trench in a semiconductor body, and forming a plurality of field plate segments in the trench. The field plate segments are electrically connected to neighboring field plate segments by connection elements so as to be disposed along an extension direction of the trench.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIGS. 1A to 1G illustrate diagrammatic sectional views of a semiconductor device.

FIGS. 4A to 4K illustrate diagrammatic sectional views of a semiconductor device when performing a method of manufacturing a semiconductor device.

DETAILED DESCRIPTION

Figure 1A:
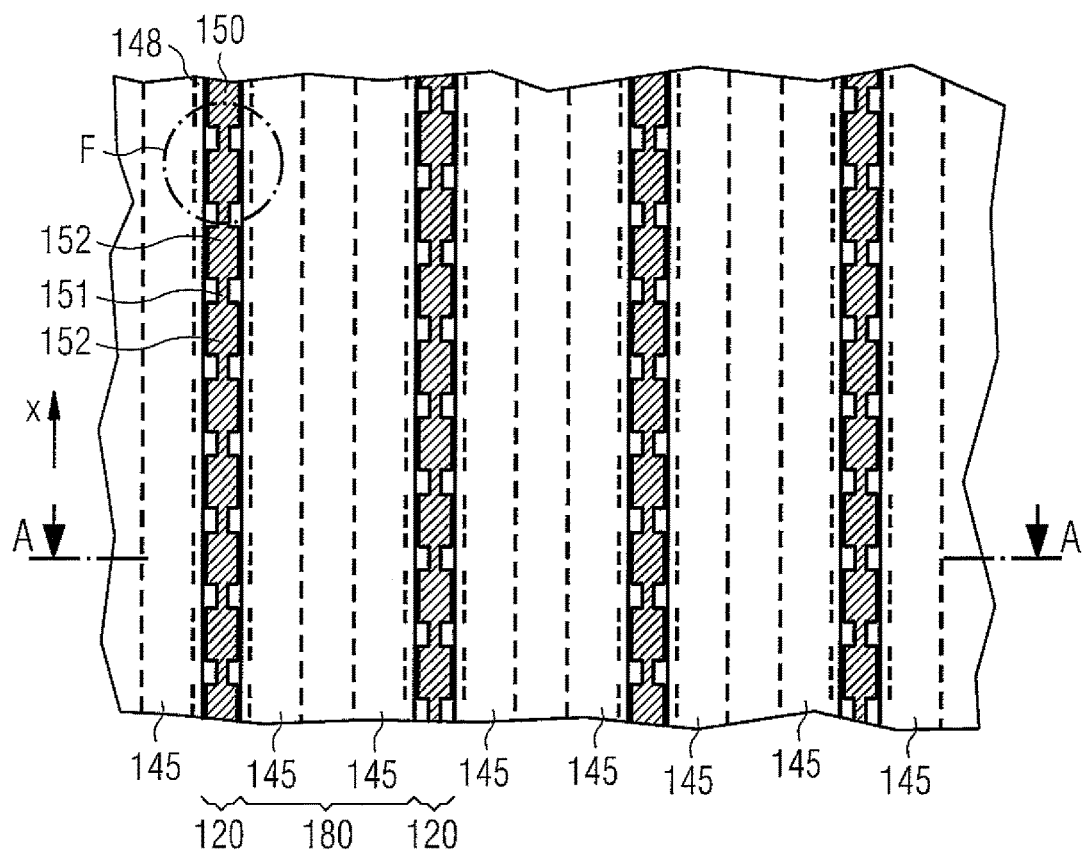

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The Figures and the description illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, insulated gate field effect transistors (IGFETs) such as metal oxide semiconductor field effect transistors (MOSFETs) may be n-channel or p-channel MOSFETs. For example, in an n-channel MOSFET, the source and the drain region are doped with n-type dopants, and the current direction is from the drain region to the source region. In a p-channel MOSFET, the source and the drain region are doped with p-type dopants, and the current direction is from the source region to the drain region. As is to be clearly understood, within the context of the present specification, the doping types may be reversed. If a specific current path is described using directional language, this description is to be merely understood to indicate the path and not the polarity of the current flow, i.e. whether the transistor is a p-channel or an n-channel transistor. The Figures may include polarity-sensitive components, e.g. diodes. As is to be clearly understood, the specific arrangement of these polarity-sensitive components is given as an example and may be inverted in order to achieve the described functionality, depending whether the first conductivity type means n-type or p-type.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

Figure 1B:
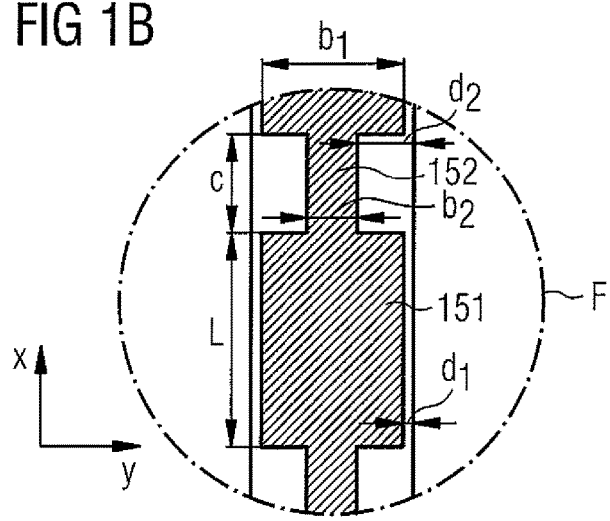
Figure 1C:
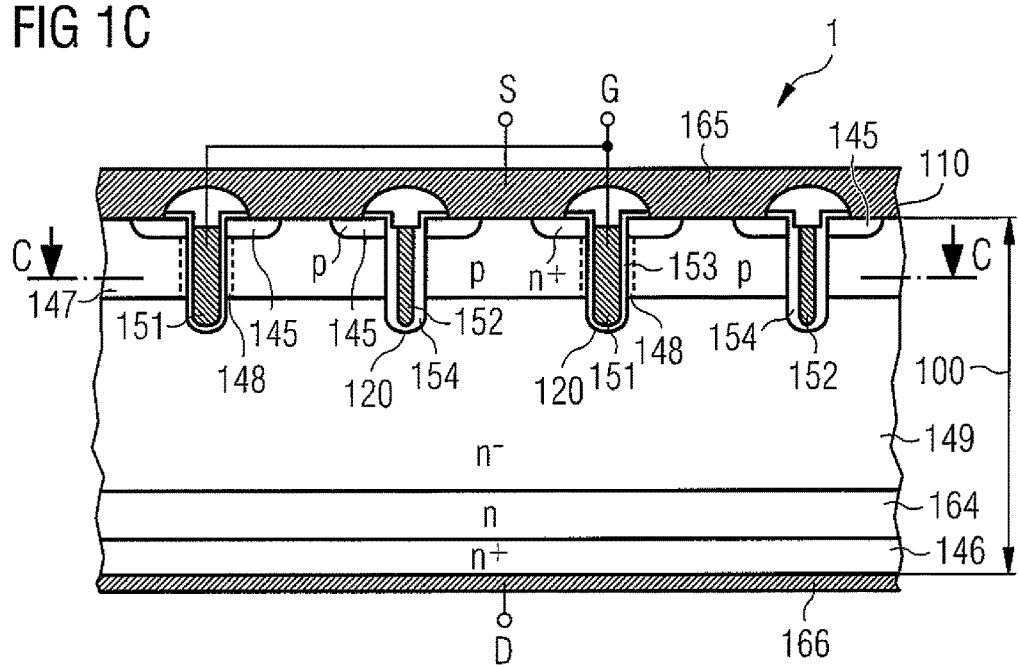

FIG. 1A is a horizontal cross-sectional view of a transistor 1 across the body region 147 along the line C-C shown in FIG. 1C. Gate trenches 120 are formed in a semiconductor body or substrate 100. Mesas 180 of a semiconductor material are defined between adjacent trenches 120. Doped portions may be arranged in the semiconductor body 100. Further, doped source portions 145 (indicated by broken lines) may be disposed within the mesas 180 at a substrate surface. The gate electrode 150 may be arranged in the trenches 120. A gate dielectric layer 153 may be disposed between the gate electrode 150 and the adjacent semiconductor material.

As is further illustrated in FIG. 1A, the gate electrode comprises a plurality of gate segments 151 that are disposed along an extension direction (x-direction) of the trench 120. The gate segments 151 are connected to neighboring gate segments by means of connection elements 152.

FIG. 1B illustrates an enlarged portion of the gate electrode 150 in the gate trench 120 as indicated by "F" in FIG. 1A. As is illustrated, a distance C between adjacent gate segments 151 is equal to or smaller than 0.5×L, wherein L denotes the length of each of the gate segments 151. The length is measured along the extension direction (x-direction) of the trench.

According to an embodiment, the gate segments and the connection elements 152 may be made of the same material, e.g. doped polysilicon. According to further embodiments, the gate segments 151 may be made of a material different from the material of the connection elements 152. For example, the material of the connection elements 152 may be a low resistivity material such as a metal. For example, the connection elements 152 may be segmented so as to be in contact on either sides thereof with adjacent gate segments 151. According to a further embodiment, the connection elements 152 may be implemented as a conductive line extending along the extension length of the trench and electrically connecting all the gate segments 151 with each other. This conductive line may be disposed at an arbitrary vertical position in the trenches, e.g. at a lower or an upper position of the gate segments. According to the embodiment of FIG. 1B, a width $b_2$ of the connection elements 152 may be smaller than a width $b_1$ of the gate segments 151, wherein the width is measured in a direction perpendicular to the extension length of the trench. For example, the width may be measured along the y-direction. Further, the thickness of an insulating layer between the gate electrode and adjacent semiconductor material may vary. For example, the thickness $d_1$ of an insulating layer 153 between the gate segments 151 and the adjacent semiconductor material may be 4 to 100 nm. The portions of the insulating layer 153 having the thickness $d_1$ implement the gate dielectric layer. Further, the thickness $d_2$ of the insulating layer 154 between the connection elements 152 and adjacent semiconductor material may be larger, e.g. 20 nm to 1 μm. The thickness d2 is larger than the thickness d1. For example, a ratio of the thicknesses d2/d1 may be at least 2, e.g. in a range from 2 to 1000.

For example, the distance C between adjacent gate segments 151 may be equal to or smaller than 0.5×L or even less, e.g. 0.2×L to 0.5×L, e.g. 0.33×L.

FIG. 1C shows a cross-sectional view of the semiconductor device shown in FIG. 1A. The cross-sectional view is taken along the line A-A in FIG. 1A. The plurality of trenches 120 is formed in a surface 110 of a semiconductor body 100. The gate electrode 150 comprises gate segments 151 and connection portions 152. A gate dielectric layer 153 is disposed between the gate segments 151 and adjacent semiconductor material. Further, portions of a thicker insulating layer 154 are disposed between the gate segments 152 and adjacent semiconductor material. The transistors further comprise source portions 145 and drain portions 146. The source portions 145 may be arranged adjacent to the main surface 110, whereas the drain portions 146 are disposed adjacent to the back side of the semiconductor body 100. The semiconductor device further comprises a body region 147, a drift zone 149 and a further doped layer 164 that is disposed between the drift zone 149 and the drain portion 146. The body region 147 may be arranged between the source portion 145 and the drift zone 149. The trenches 120 may penetrate through the body region 147 and extend to the drift zone 149.

The gate electrodes 150 are electrically connected to a gate terminal. The source regions 145 may be in contact with a source metal layer 165 that is electrically connected to a source terminal. The semiconductor device may further comprise a drain metallization layer 166 that is disposed on a back side surface of the semiconductor body 100 and which is electrically connected to the drain region 146.

When the transistor is switched on, e.g. by applying a suitable voltage to the gate electrode 150, a conductive inversion layer is formed at the boundary between the body region 147 and the gate dielectric 153 having the thickness $d_1$. Accordingly, the transistor is in a conducting state from the source region 145 to the drain region 146 via the drift zone 149. In case of switching-off, no conductive channel is formed at the boundary between the body region 147 and the gate dielectric 153. Further no conductive inversion layer is formed at the boundary between the body region 147 and the insulating layer having the thickness $d_2$ adjacent to the connection elements 152. In other words, channel regions 148 may be formed adjacent to the gate segments 151, whereas no channel regions may be formed adjacent to the connection elements 152.

As is illustrated in FIG. 1A, the gate electrode 150 is segmented. It has been shown that due to the segmentation of the gate electrode, the gate charge may be reduced, resulting in an improved device performance. Due to the specific ratio between the length of the gate segments 151 and the distance C between adjacent gate segments, the output charge may be reduced while slightly increasing the on-resistance of the transistor. As a result, the "figure of merit" $FOM_{oss}$ (Rdson ×output charge) may be further reduced.

The transistor comprises a plurality of single transistor cells disposed on either sides of the trenches 120. The single transistor cells 120 are connected in parallel by means of the source metallization layer 165 and the common drain metallization layer 166.

Figure 1D:
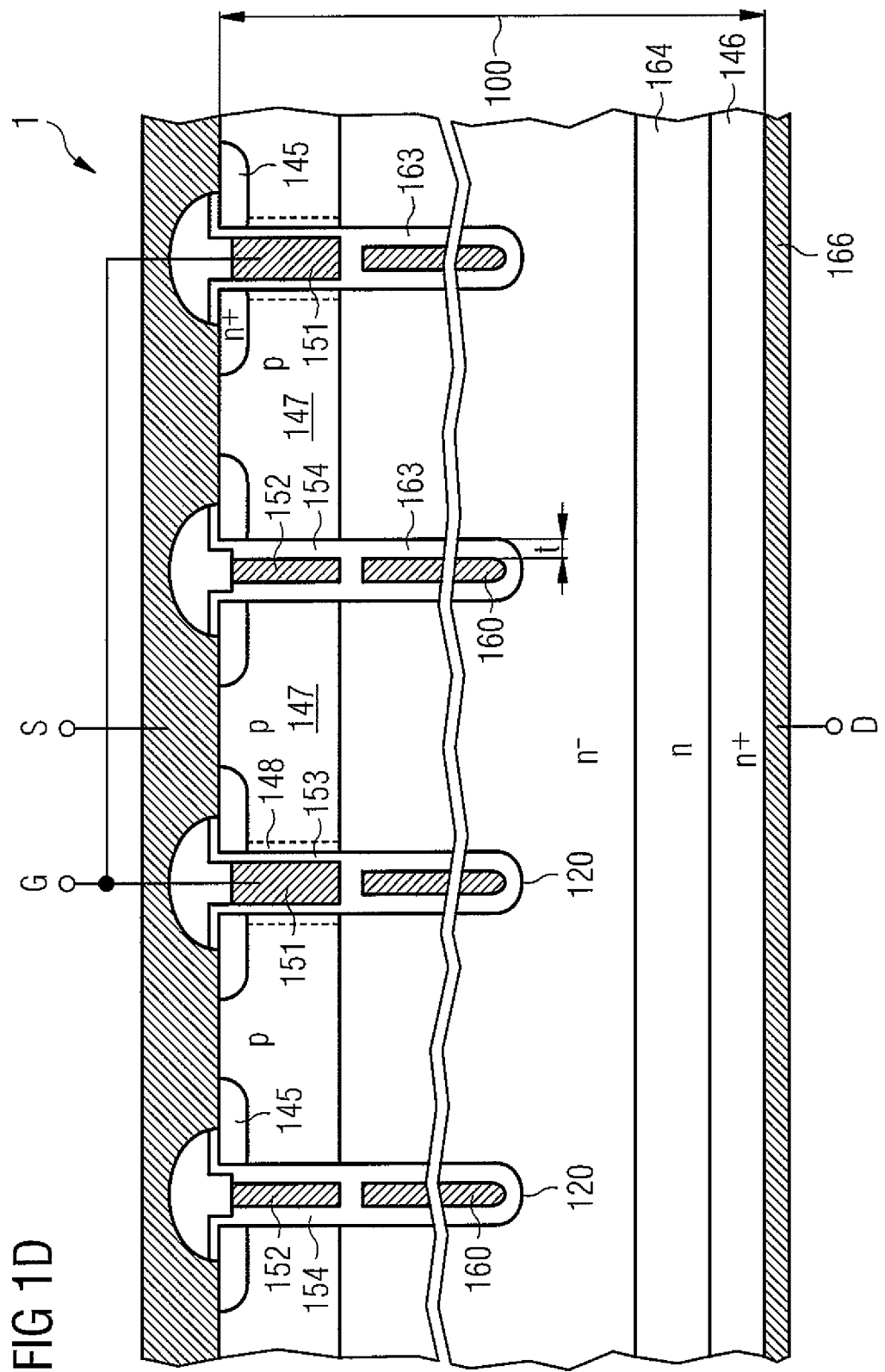

FIG. 1D shows a further embodiment. As is illustrated, the semiconductor device further comprises a field plate 160 which is disposed beneath the gate electrode 150. The field plate 160 is disposed in the trenches 120 and is insulated from the adjacent body material by means of a field dielectric layer 163. For example, the field dielectric layer 163 may have a thickness of t that may be measured in a horizontal direction. The field plate 160 may be electrically coupled to a source potential or any other suitable potential. The field plate 160 may be implemented as a continuous field plate. The further components of the semiconductor device shown in FIG. 1D are similar to those illustrated with reference to FIGS. 1A to 1C.

FIG. 1E shows a further embodiment. Differing from the embodiment shown in FIG. 1D, the field plate 160 is not formed as a continuous field plate having approximately the same cross-sectional shape along the extension direction of the trench. According to the embodiment of FIG. 1E, the field plate is segmented. In other words, the field plate 160 comprises a plurality of field plate segments 161 which are disposed along the extension direction of the trench 120. The field plate segments 161 are electrically connected to neighboring field plate segments by means of second connection elements 162. The second connection elements 162 may be implemented as segmented portions that are electrically connected to neighboring field plate segments 161. According to a further embodiment, the connection elements 162 may be implemented as a continuous line which contacts each of the field plate segments 161. The second connection elements 162 may be disposed at an arbitrary vertical position within the trench. The second connection elements 162 may be disposed below or above or at any vertical position of the field plate segments 161. The second connection elements 162 may have a thickness m2 that is smaller than a thickness m1 of the field plate segments. The thickness m1 of the field plate segments and the thickness m2 of the second connection elements 162 are measured in a depth direction of the substrate, e.g. the z-direction. For example, a ratio of the thickness m1 of the field plate segments 161 to the thickness m2 of the second connection elements 162 may be 2 or more. The thickness of the field plate segments may correspond to a difference between the top surface and the bottom surface of the field plate segments. Likewise, the thickness of the second connection elements may correspond to a difference between the top surface and the bottom surface of the second connection elements. According to an embodiment, a distance $C_2$ between the field plate segments 161 may fulfill the following relationship: $0.5 \times t \leq C_2 \leq 1.5 \times t$, wherein t denotes the thickness of the field dielectric layer 163. Further, the length $L_2$ of the field plate segments may be approximately equal to $C_2$. The length of the field plate segments 161 and the distance $C_2$ between the field plate segments are further illustrated in FIGS. 3A and 3B.

FIG. 1F shows a further embodiment of a semiconductor device. The embodiment FIG. 1F basically corresponds to the embodiment of FIG. 1E. Differing from the embodiment shown in FIG. 1E, the second connection elements 162 are disposed beneath the connection elements 152 between gate segments 151. In a corresponding manner, the field plate segments 161 are disposed beneath the gate segments.

Figure 1G:
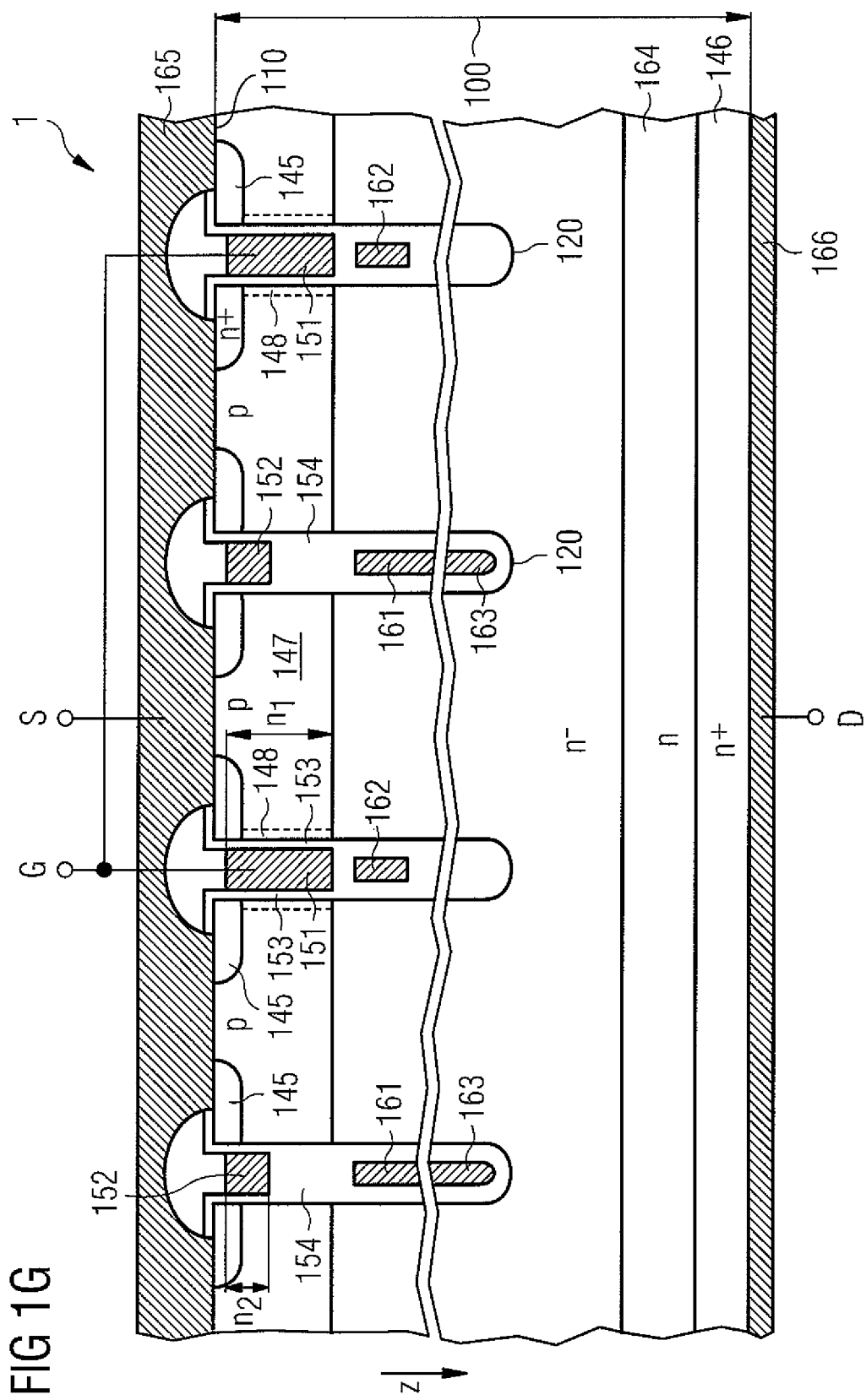

FIG. 1G shows still a further embodiment. Different from the embodiment of FIG. 1E, the connection elements 152 between gate segments 151 are implemented as portions similar to the gate segments 151 which extend to a smaller depth than the gate segments 151. For example, the thickness $n_2$ of the connection elements 152 may be less than 0.5× the thickness $n_1$ of the gate segments. The thickness $n_2$ of the connection elements 152 and the thickness $n_1$ of the gate segments 151 are measured in a depth direction of the substrate, e.g. the z-direction. The thickness of the connection elements 152 and the thickness of the gate segments 151 correspond to the difference between top surface and the bottom side. The connection elements 152 may be disposed at an arbitrary position along the position along the depth direction of the gate electrode. The dielectric layer adjacent to the connection elements may have an arbitrary thickness measured in a direction perpendicular to the extension direction, e.g. the y-direction. For example, the thickness may correspond to the thickness of the gate dielectric layer. According to a further example, the thickness may correspond to the thickness of the thicker dielectric layer 154.

Generally, applying to all the embodiments, gate segments or field plate segments of neighboring trenches may be aligned along the extension direction, i.e. the gate segments may be disposed and, optionally, the field plate segments may be disposed at the same position along the extension direction (x direction). According to a further embodiment, the gate segments may be shifted with respect to the field plate segments. For example, gate segments may be disposed at the same position along the extension direction as second connection elements, and field plate segments may be disposed at the same position along the extension direction as connection elements. Further, any other kind of positional relationship may be established. According to an embodiment, the gate segments and, optionally, the field plate segments of neighboring trenches 120 may be staggered or offset along the extension direction. For example, the gate segments of a first trench may be disposed at the position along the extension direction of a connection element of a neighboring trench and vice versa. Further, the field plate segments of a first trench may be disposed at the position along the extension direction of a second connection element of a neighboring trench and vice versa.

Figure 2A:
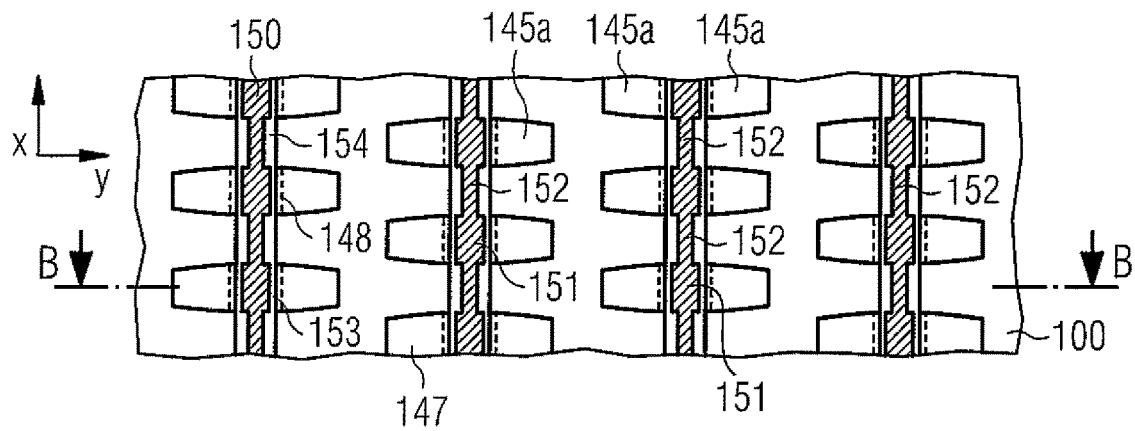
FIGS. 2A and 2B illustrate diagrammatic sectional views of a semiconductor device.
Figure 2B:
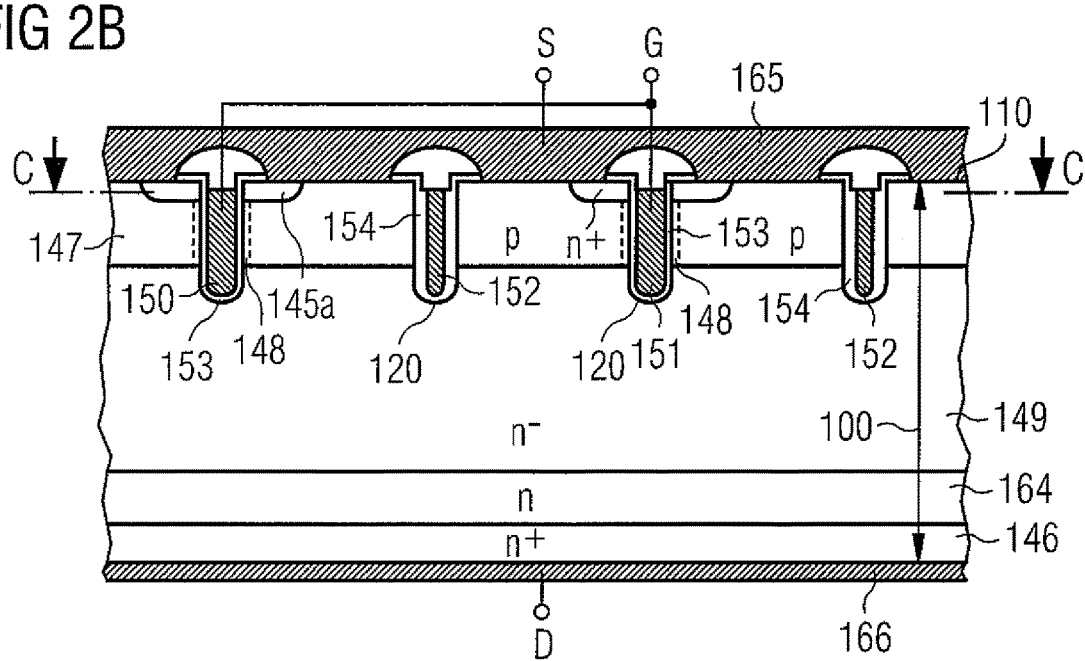

FIG. 2A illustrates a cross-sectional view of a semiconductor device according to a further embodiment. The cross-sectional view of FIG. 2A is taken along the line C-C as shown in FIG. 2B. Differing from the embodiment illustrated in FIG. 1A, a ratio between the length L of each of the gate segments 151 and the distance C between adjacent gate segments 151 may be arbitrary, and the source region 145 comprises a plurality of source segments 145*a* separated from each other and disposed along the extension direction of the trench. Accordingly, the semiconductor device comprises a gate electrode 150 in a trench 120 in a semiconductor body 100. The gate electrode 150 comprises a plurality of gate segments 151 disposed along an extension direction (x-direction) of the trench 120, the gate segments 151 being electrically connected to neighboring gate segments 151 by means of connection elements 152. The semiconductor device 1 further comprises a source region 145 disposed at a surface 110 of the semiconductor body 100 adjacent to the trench 120. The source region 145 comprises a plurality of source segments 145*a* separated from each other and disposed along the extension direction of the trench. Due to the segmentation of the source region 145, a lateral current flow along the surface 110 of the semiconductor device may be prevented, resulting in an improved device performance.

FIG. 2B shows a cross-sectional view of the semiconductor device illustrated in FIG. 2A that is taken along the line B-B illustrated in FIG. 2A. As is specifically shown, the source region is segmented to form source segments 145*a*. Accordingly, the segments 145*a* are disposed so as to be adjacent to the gate segments 151, whereas no source segment 145*a* is disposed adjacent to the connection elements 152.

Figure 3A:
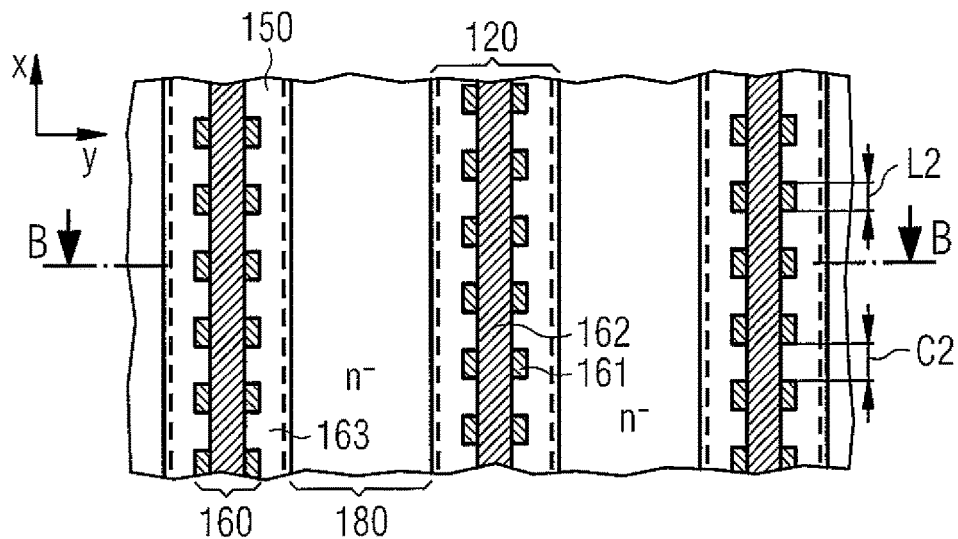
FIGS. 3A and 3B illustrate diagrammatic sectional views of a semiconductor device.
Figure 3B:
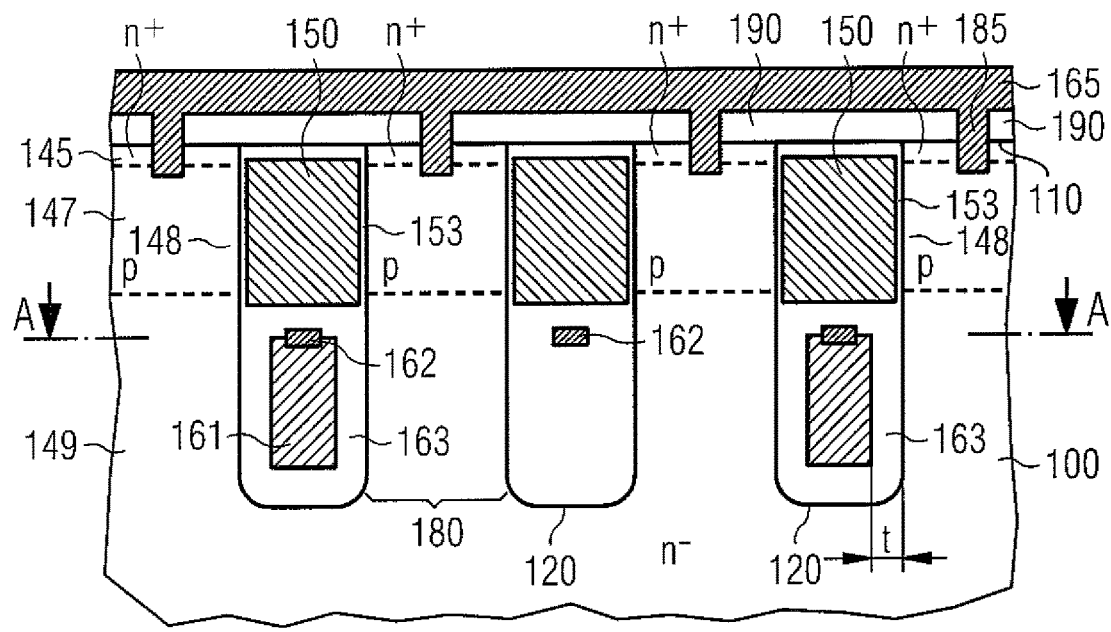

FIG. 3A illustrates a horizontal sectional view of a semiconductor device according to a further embodiment. The sectional view of FIG. 3A is taken along the line A-A as illustrated in FIG. 3B. In particular, this sectional view is taken so as to intersect the field plate 160 which is disposed in a lower portion of the trenches 120. The semiconductor device shown in FIG. 3A comprises a gate electrode (indicated by broken lines) 150 and a field plate 160, the gate electrode 150 and the field plate 160 being disposed in a trench 120 formed in a semiconductor body 100. The field plate 160 comprises a plurality of field plate segments 161 disposed along an extension direction (x-direction) of the trench 120. The field plate segments 161 are electrically connected to neighboring field plate segments 161 by means of connection elements 162. A mesa 180 is defined between adjacent trenches 120. For example, a distance C2 between adjacent field plate segments 161 may be approximately equal to a thickness t of the field dielectric layer, wherein the length and the distance are measured along the extension direction (x-direction) of the trench. The thickness of the field dielectric layer t is measured along a horizontal direction perpendicular to the extension direction of the trench.

As indicated in FIG. 3A, the connection elements may be implemented by a continuous line, and the field plate segments 161 may be made of a material different from the material of the connection elements and may be separate from the connection elements 162. According to a further embodiment, the field plate segments 161 and the connection elements may be made of the same material. As is further indicated in FIG. 3A, the gate electrode 150 may be implemented as a continuous gate electrode. According to a further embodiment, the gate electrode may comprise a plurality of gate segments 151 that are disposed along the extension direction of the trench and which are electrically connected to neighboring trench segments 151 by means of further connection elements 152, in a similar manner as was illustrated in FIG. 1A.

Figure 3C:
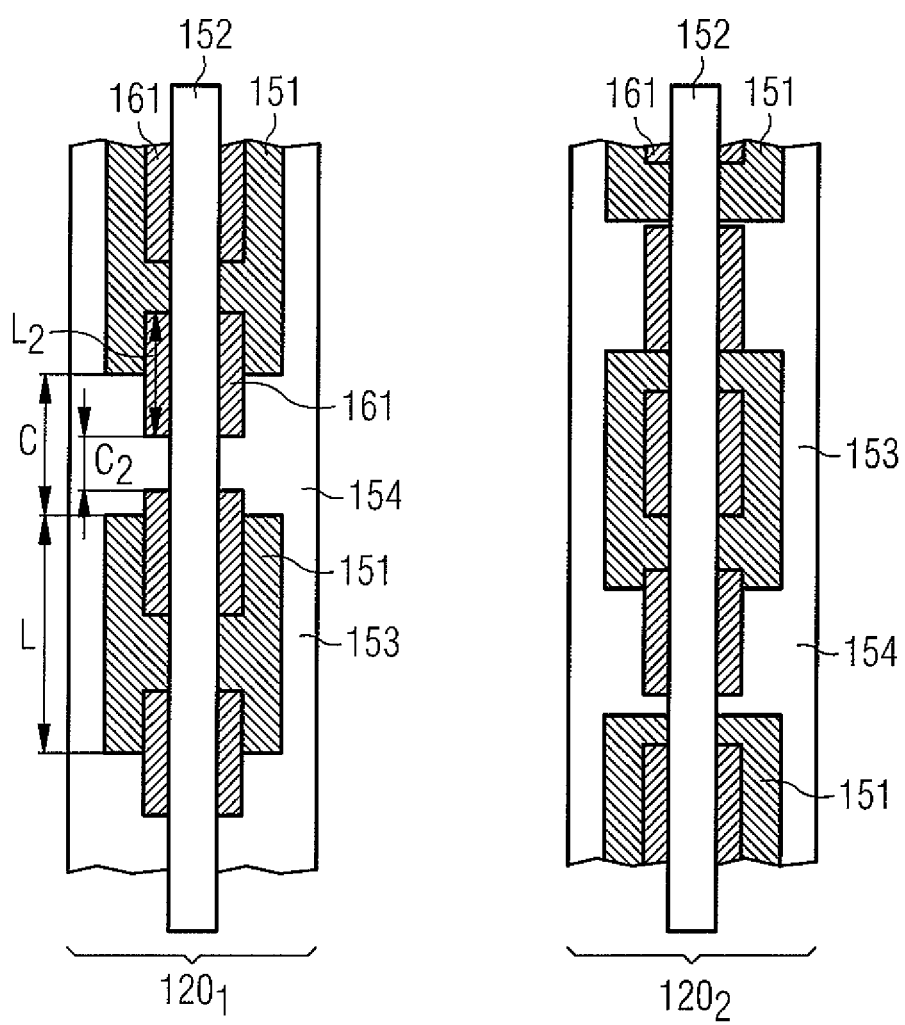
FIG. 3C illustrates further components of a semiconductor device according to an embodiment.

According to a further modification, the gate segments may have portions that do not overlap with field plate segments. This is, for example, illustrated in FIG. 3C. FIG. 3C shows a schematic plan view of a semiconductor device 1 comprising a plurality of gate segments 151 and a plurality of field plate segments 161. The gate segments 151 are electrically connected by a conductive line implementing the further connection elements 152. The field plate segments 161 are electrically connected by connection elements (not shown in this drawing). Sections of a gate dielectric layer 153 are disposed between the gate segments 151 and the adjacent semiconductor material, sections of a thicker dielectric layer 154 are disposed between the further connection elements and the adjacent semiconductor material. As is shown, the distance C between adjacent gate segments 151 and the length L of the gate segments 151 are different from the distance $C_2$ between the field plate segments 161 and the length $L_2$ of the field plate segments, respectively. Further, the gate segments 151 may only partially overlap with the field plate segments 161. As is further illustrated in FIG. 3C, the gate segments 151 of the first trench 120$_1$ may be staggered or offset with respect to the gate segments 151 of the second trench 120$_2$.

FIG. 3B shows a cross-sectional view of the semiconductor device shown in FIG. 3A. The sectional view of FIG. 3B may be taken along the line B-B as illustrated in FIG. 3A. As is shown, field plate segments 161 are disposed in a lower trench portion 120 and are electrically connected by means of connection elements 162. Within the sectional view of FIG. 3B, the gate electrode 150 is arranged as a continuous gate electrode. The source metal layer 165 may be connected via contacts 185 with the source region 145 and the body region 147. The source metal layer 165 may be insulated from the main surface 110 of the semiconductor body 100 by means of a dielectric layer 190. The functionality of the semiconductor device illustrated in FIG. 3B is similar to that shown in FIGS. 1A to 1E.

Due to the fact that the field plate comprises segments, the performance of the field plate may be further improved.

FIGS. 4A to 4K illustrate elements of a method of manufacturing a semiconductor device according to an embodiment. In particular, the sectional views shown in FIGS. 4A to 4K illustrate a method of forming segments 161 of the field plate 160. According to the embodiment illustrated in FIGS. 4A to 4K, field plate segments 161 may be selectively formed due to a varying width of the trench 120. FIGS. 4A to 4K do not show any doped portions for implementing the source regions the drift zone and others. As is to be clearly understood, these portions are defined in a manner as is generally known.

Figure 4A:
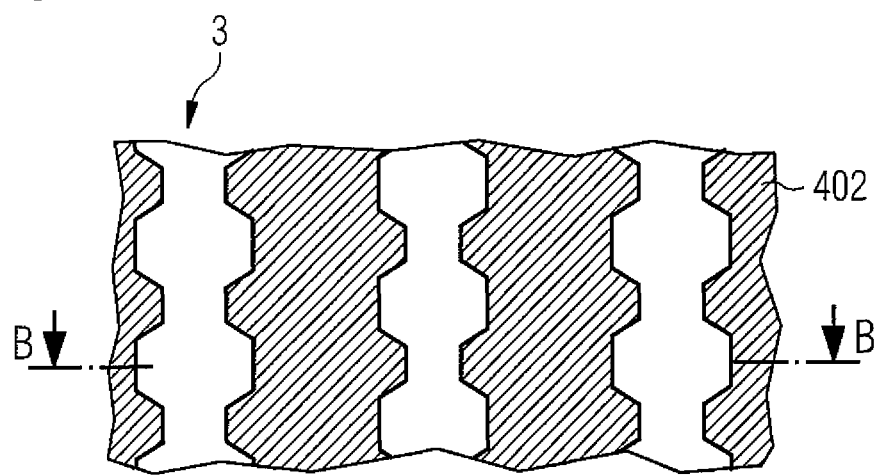
Figure 4B:
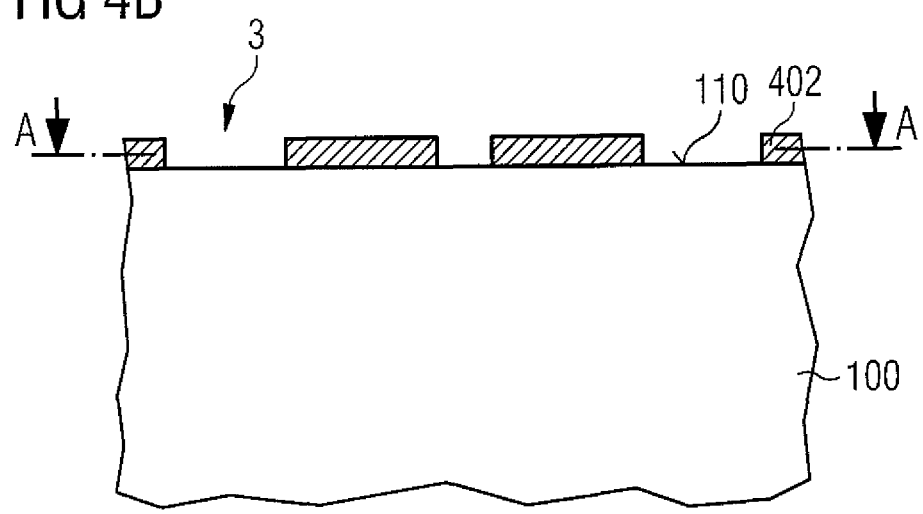

FIG. 4A shows a horizontal sectional view that is taken along the line A-A shown in FIG. 4B. FIG. 4A shows a photoresist pattern 402 which may be used for defining trenches 120 in a semiconductor body. The photoresist pattern 402 comprises opening portions having a varying width along an extension direction of the stripe-shaped pattern.

FIG. 4B shows a cross-sectional view of the work piece 3 along the line B-B shown in FIG. 4A. As is shown, the photoresist layer 402 is formed over a main surface 110 of a semiconductor body 100. Openings are formed in the photoresist layer 402, the openings having a varying width. In a next step, an etching step is performed which may optionally etch portions having a larger width at a higher etching rate. However, as is to be clearly understood, the etching rates may be independent from the width of the trench to be formed. After etching the trenches, the photoresist layer 402 is removed from the surface 110 of the semiconductor body 100.

As is illustrated in FIG. 4C, the trenches comprise first trench portions 120a having a width $S_1$ measured perpendicularly with respect to the extension length of the trenches. The trenches 120 further comprise second trench portions 120b having a width $s_2$ which is smaller than the width $s_1$. The second width $s_2$ may be approximately 200 to 600 nm, whereas the first width $s_1$ may be 220 to 620 nm. For example, the first width $s_1$ may be at least 20 nm more than $s_2$. Further, the depth of the second trench portion 120b $t_2$ may be smaller than the depth $t_1$ of the first trenches 120a. For example, the depth of the trenches may be 1 to 5 μm. Thereafter, a field dielectric layer 163 is formed over the resulting surface.

The field dielectric layer 163 may be formed to have a thickness so that the second trench portions 120b are completely filled with the field dielectric material, whereas a portion of the first trench portion 120a is conformally covered with the field dielectric layer 163.

Figure 4E:
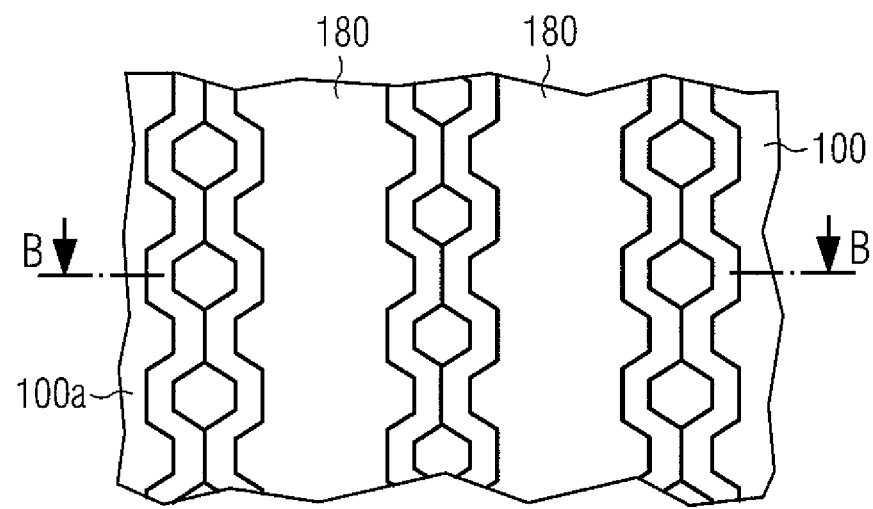

FIG. 4D shows a sectional view of the resulting structure. As is shown, the field dielectric layer 163 is formed in the first trench portions 120a as a conformal layer. FIG. 4E shows a sectional view along the line A-A illustrated in FIG. 4D. Thereafter, a conductive material is filled in the trenches followed by etching back the conductive material. Further, the upper portion of the field dielectric layer 163 is etched back.

Figure 4F:
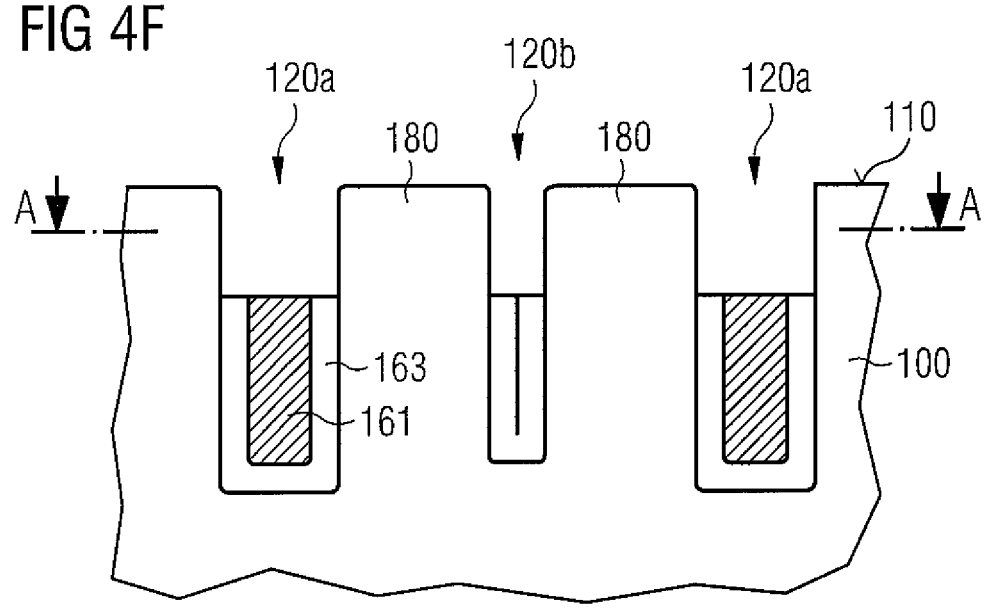
Figure 4I:
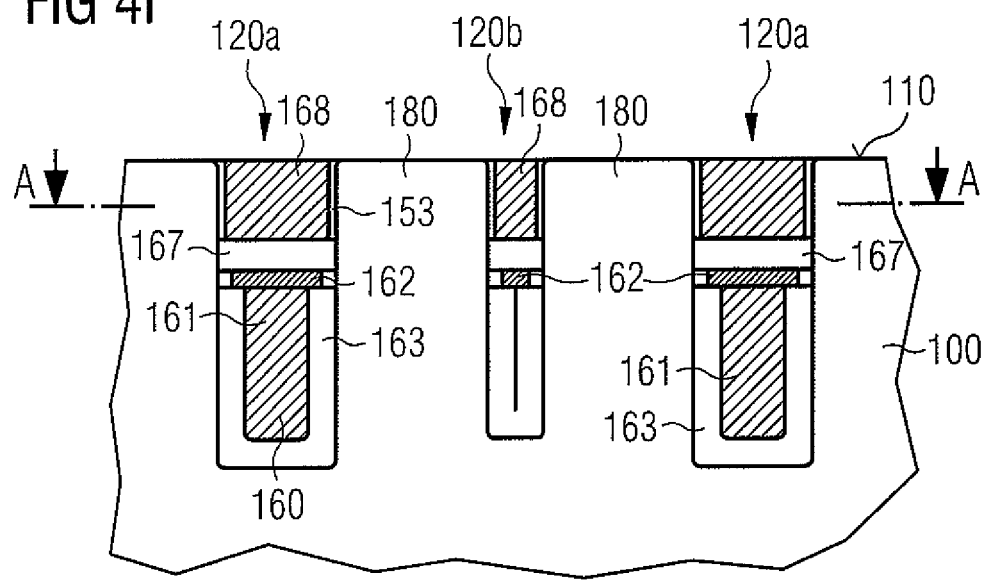

FIG. 4F shows an example of a resulting structure. As is shown, in the first trench portions 120a field plate segments 161 are disposed in a lower trench portion. Further, the field dielectric layer 163 completely fills the lower portion of the second trench portion 120b. Then, a conductive layer which forms the connection elements 162 may be formed in the trenches. For example, this may be achieved by first depositing a silicon oxide layer, e.g. by a chemical vapor deposition (CVD) method using tetraethylorthosilicate (TEOS) as a starting material, followed by an etching step which etches spacers adjacent to the sidewall of the trench. Then, first, a TiN barrier layer may be deposited, followed by a metal filling such as tungsten. Further, a recessing step may be performed.

FIG. 4G shows an example of a resulting structure. Thereafter, a HDP (high density plasma) oxide forming step may be performed. As a result, the insulating layer 167 which may comprise silicon oxide is formed over the connection elements 162.

Figure 4J:
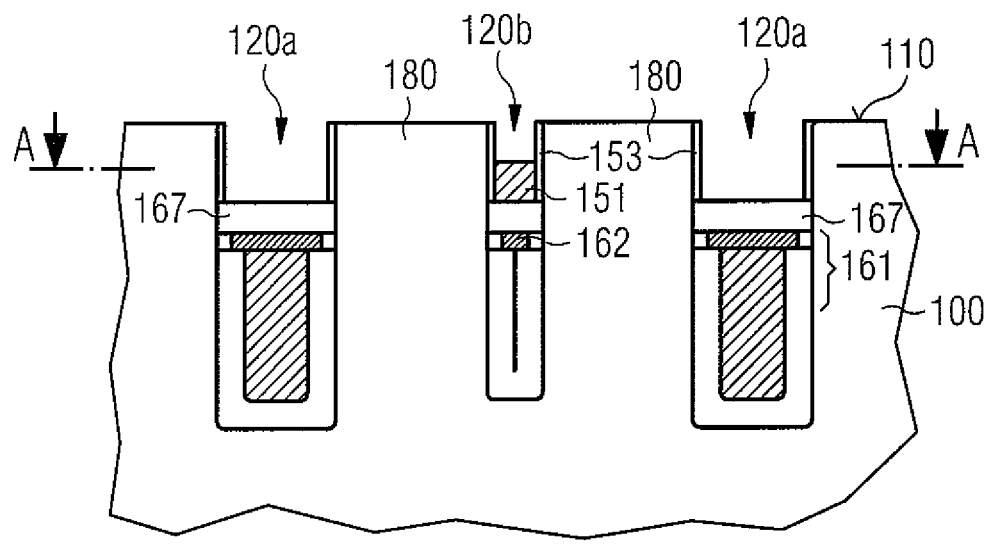

FIG. 4H shows an example of a resulting structure. As is shown, the conductive layer 162 is formed as a continuous line which connects adjacent field plate segments 161 with each other. Thereafter, a thin silicon oxide layer 153 may be formed adjacent to the upper sidewalls of the trenches 120, e.g. by thermal oxidation. For example, the gate oxide layer 153 may have a thickness of 5 to 50 nm. Then, a gate conductive layer 168 is filled in the upper portions of the trenches. In the next step, a recessing process for etching an upper portion of the gate conductive layer 168 may be performed. A photolithographic method may be employed so as to remove the gate conductive material 168 from the first trench portions. As is clearly to be understood, according to a further embodiment, the gate dielectric layer 153 may be formed to have a large thickness in the first trench portions 120a so as to basically implement the structure illustrated in FIG. 1A. FIG. 4J shows an example of a resulting structure.

Figure 4K:
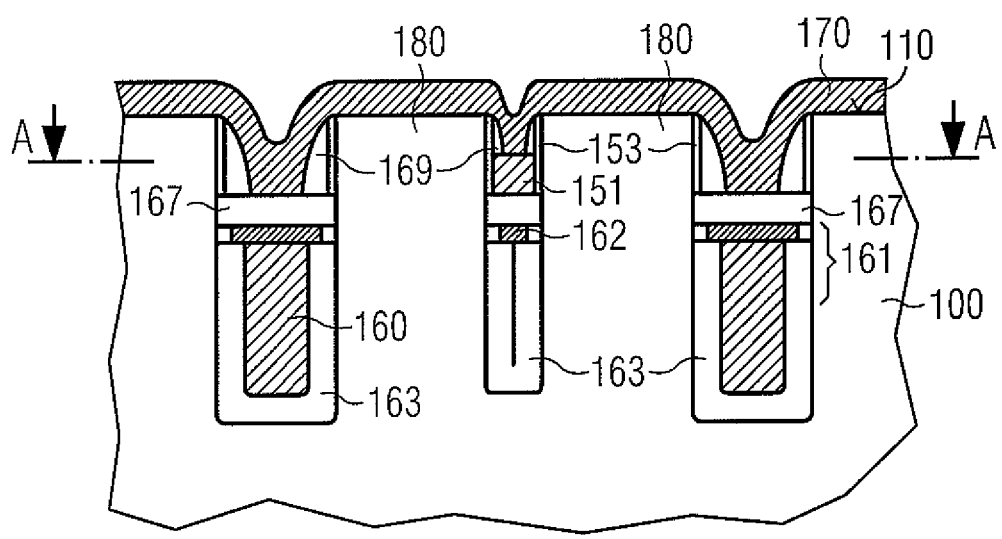

Thereafter, a further spacer is formed, for example by a CVD method using TEOS as a starting material. For example, a thickness of this additional spacer 169 may be at least the double of the thickness of the gate dielectric layer 153. Thereafter, a further metal may be formed over the resulting surface. For example, a tungsten layer 170 may be formed so as to be electrically connected to the gate segments 151. FIG. 4K shows an example of a resulting structure.

Thereafter, further recessing steps and processing steps may be performed as is generally accomplished during the manufacture of transistors. In particular, the connection elements 152 may be formed of the conductive layer 170 in a later processing step.

According to further embodiments, the connection elements 152 may be formed in an alternative manner, e.g. in a self-aligned manner.

FIGS. 5A to 5H illustrate a further method of manufacturing a transistor. Differing from the embodiment illustrated in FIGS. 4A to 4K, the trenches 120 are formed to have a homogeneous width along their extension length and the portions in which the segments of the field plate 160 are to be formed, are photolithographically defined. Generally, when photolithographically segmenting the field plate 160, problems may arise in achieving a small distance between adjacent field plate segments. The following illustrates a specific method by which a small distance between adjacent field plate segments may be achieved.

Figure 5A:
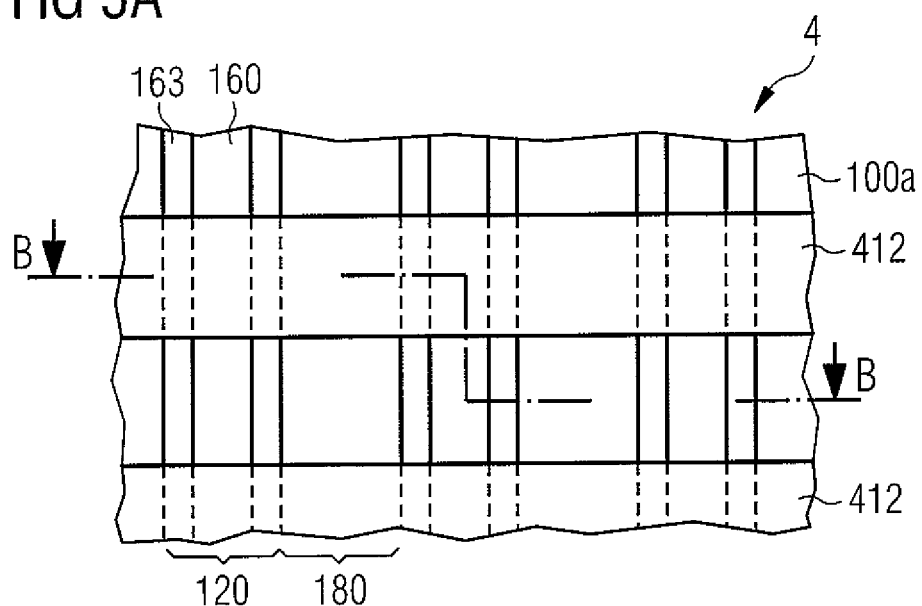
FIGS. 5A to 5H illustrate diagrammatic sectional views of a semiconductor device when performing a method of manufacturing the semiconductor device.

Starting point for performing the method according to the embodiment illustrated in FIGS. 5A to 5H is a work piece 4 illustrated in FIG. 5A comprising a semiconductor body 100 and trenches 120 formed in a main surface 110 of the semiconductor body 100. A field dielectric layer 163 is formed adjacent to the sidewalls of the trenches 120. Further, a conductive filling for forming the field plate 160 is filled in the trenches 120. Mesas 180 are defined between adjacent trenches 120. The following Figures do not explicitly show doped portions. However, as is to be clearly understood, doped portions may be present in the semiconductor body 100.

A photoresist layer is formed over the resulting structure and patterned to a lines/spaces pattern, wherein the lines extend perpendicularly with respect to an extension direction of the trenches 120. The width between adjacent stripes 412 may be larger than the width of each of these stripes.

Figure 5B:
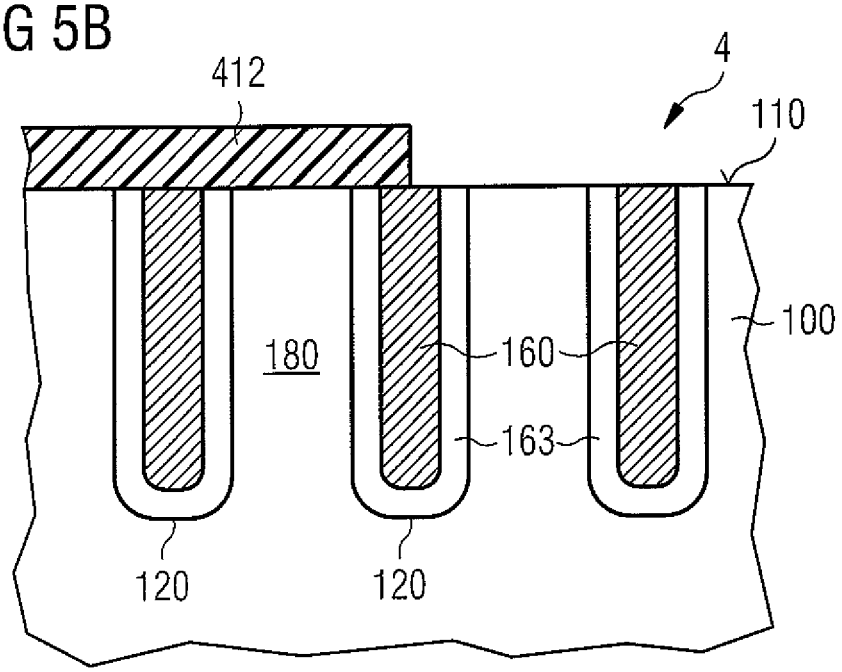
Figure 5C:
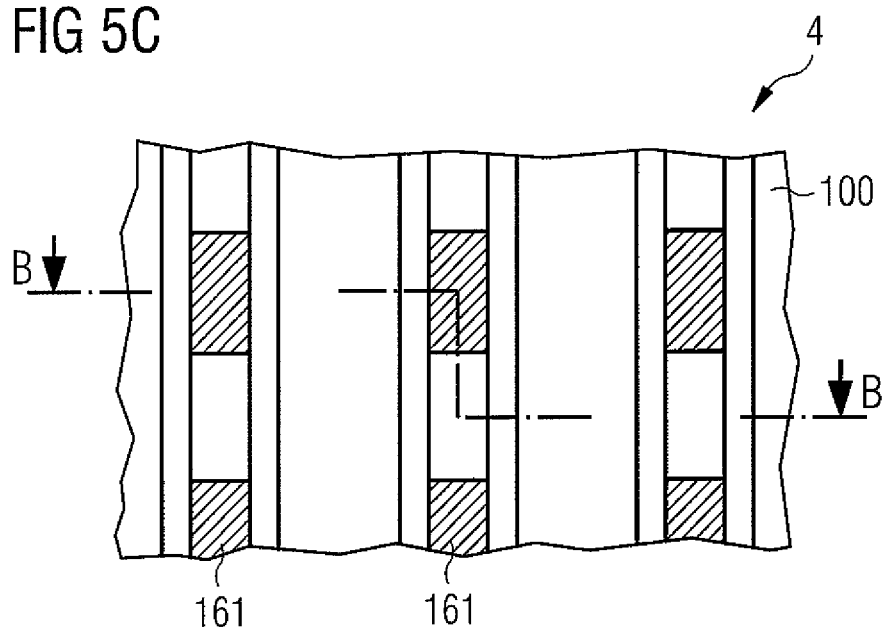
Figure 5D:
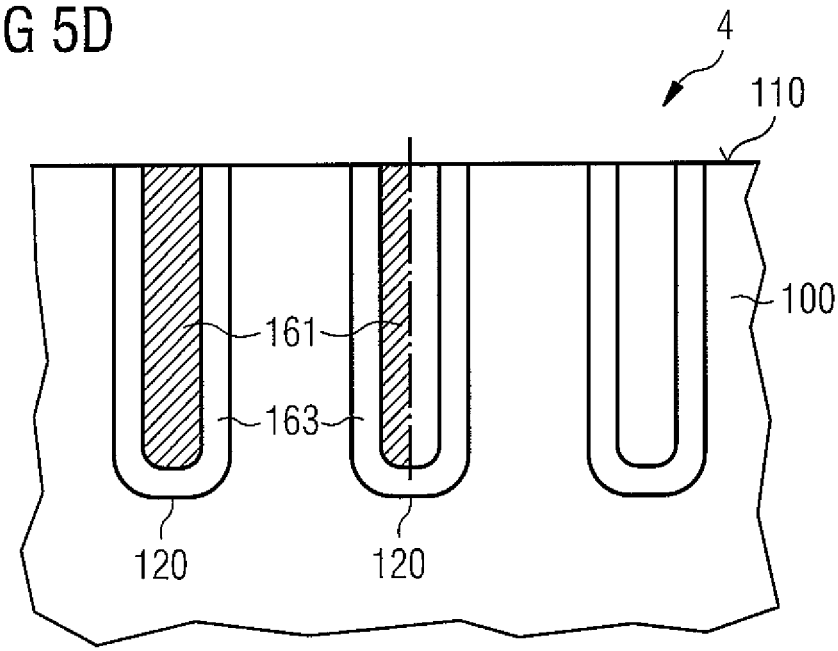

FIG. 5B shows a cross-sectional view of the work piece 4 taken along the line B-B as illustrated in FIG. 5A. As is shown, this cross-sectional view is taken so as to intersect portions covered with a photoresist material 412 and portions which are not covered by the photoresist material 412. An etching step for etching the conductive material forming the field plate 160 is performed so that the conductive material is removed from trenches 120 which are not covered by the photoresist layer 412. Further, the conductive material is not removed from the trenches covered by the photoresist layer 412. FIG. 5C shows a plan view of a resulting structure. FIG. 5D shows a cross-sectional view of a resulting structure which is taken along the line B-B.

Figure 5E:
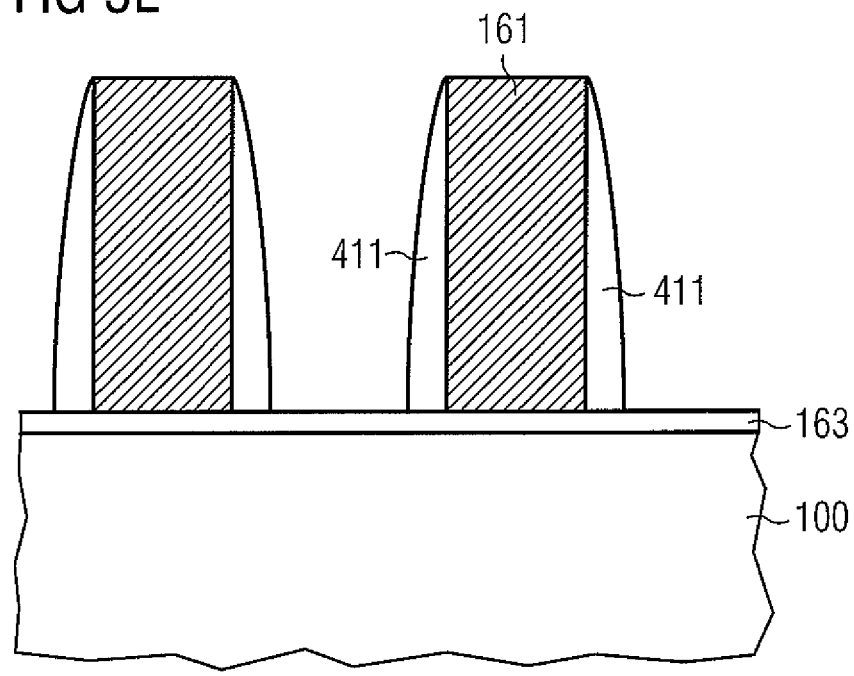
Figure 5F:
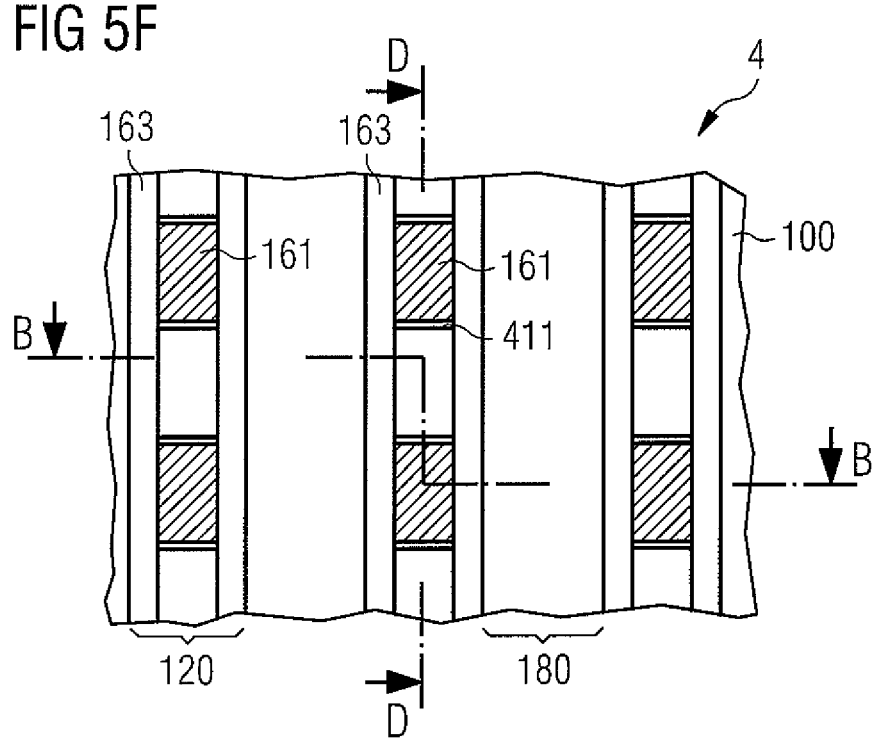

FIG. 5E shows a cross-sectional view of the structure along the line D-D as illustrated in FIG. 5F, i.e. along the extension direction of the trench. As is shown, trench segments 161 are disposed to be spaced from each other. The field plate segments 161 are disposed over an insulating field dielectric layer 163. Spacers 411 of an insulating material are formed, e.g. by conformally depositing the silicon oxide layer, followed by an anisotropic etching step which etches horizontal portions at a higher etching rate than vertical portions. As is further illustrated in FIG. 5E, spacers 411 are arranged adjacent to field plate segments 161.

FIG. 5F shows a plan view of the resulting structure.

Figure 5G:
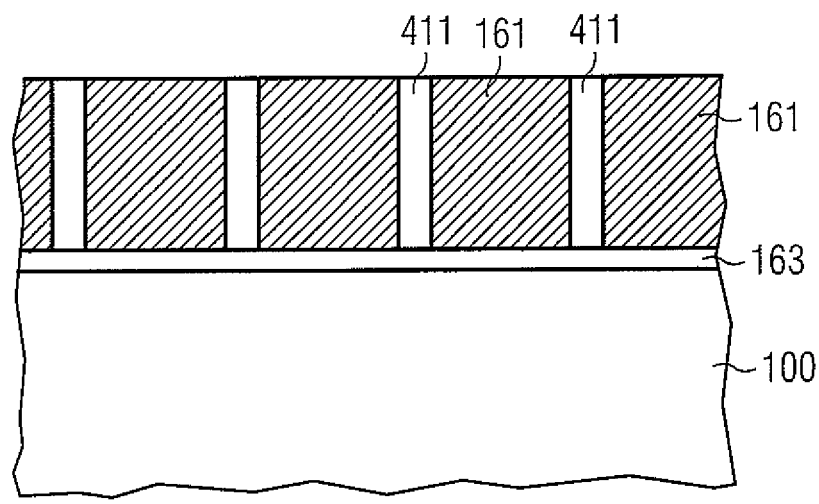

Thereafter, the material of the field plate 160 is again deposited so as to fill the spaces between the adjacent segments illustrated in FIG. 5E. Then, a CMP step may be performed. As a result, the spaces between adjacent field plate segments of FIG. 5E are filled with further field plate segments 161. FIG. 5G shows an example of a resulting structure.

Figure 5H:
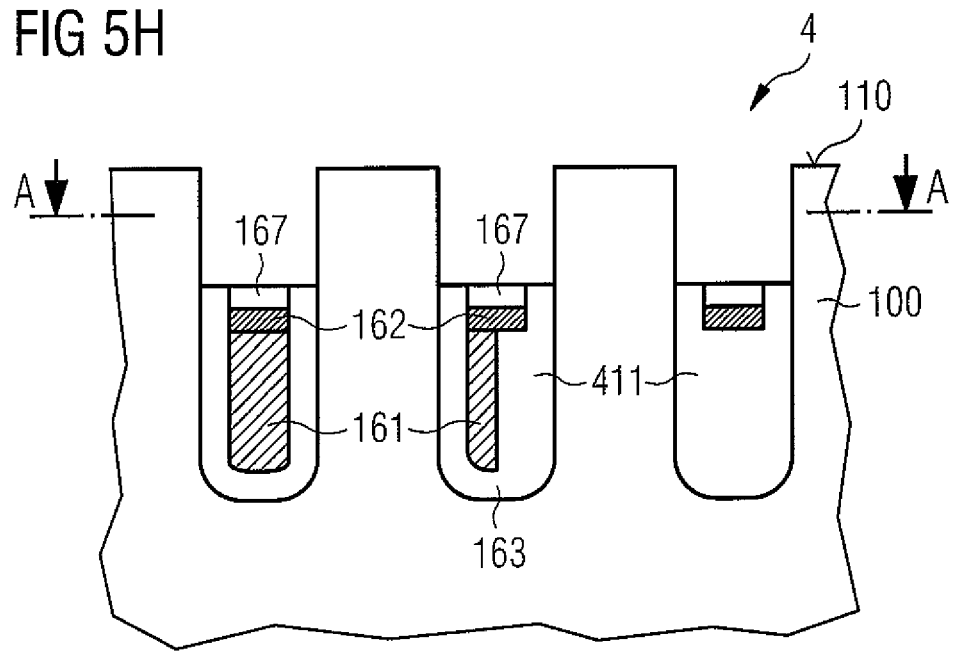

Thereafter, the conductive material of the field plate segments is recessed, and a further conductive layer is deposited so as to form the connection elements 162. For example, a metal layer or other low resistive layer may be formed. A recessing step may be performed, followed by a step of forming an insulating layer 167. Then, the upper portions of the field dielectric layer 163 may be etched. FIG. 5H shows a cross-sectional view of a resulting structure along the line B-B as is illustrated in FIG. 5F.

As is shown, field plate segments 161 are disposed and separated from each other. Adjacent field plate segments are connected by means of connection elements 162. The connection elements may form a continuous line over the field plate segments. Thereafter, the gate electrode may be formed in a manner as has been discussed above. As is clearly to be understood, the gate electrode may also be formed as a continuous gate electrode which is not segmented into gate segments.

FIGS. 6A to 6F illustrate a further method according to an embodiment. According to this embodiment, the field plate 160 may be implemented as a continuous field plate, and the gate electrode 150 may be segmented. Starting point is a work piece 6 comprising trenches 120 in a semiconductor body 100. Mesas 180 are defined between adjacent trenches. A field dielectric layer 163 is formed adjacent to sidewalls of the trenches 120.

Figure 6A:
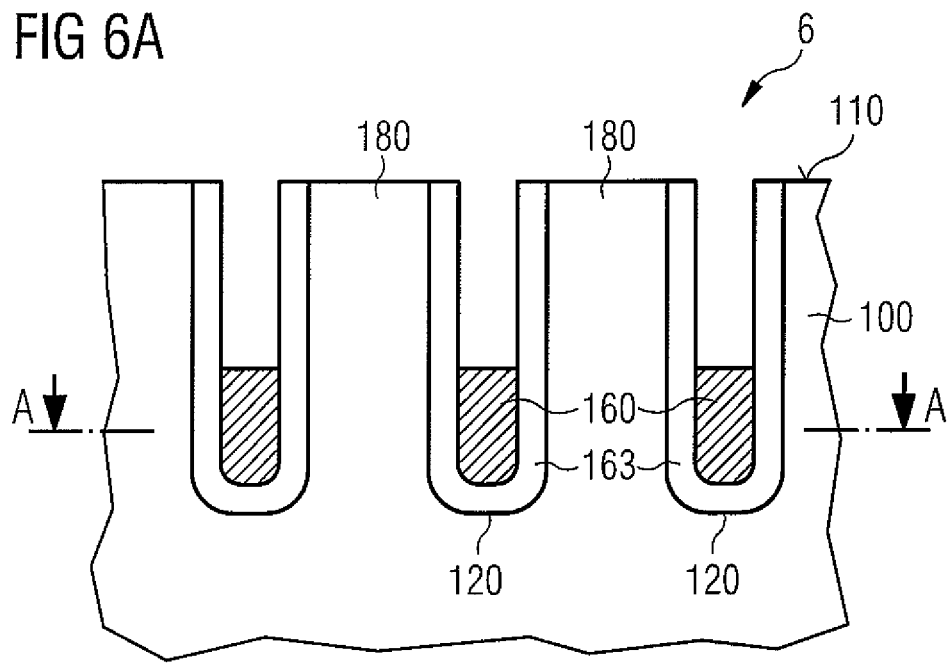
FIGS. 6A to 6F show diagrammatic sectional views of a semiconductor device when performing a method of manufacturing the semiconductor device.
Figure 6B:
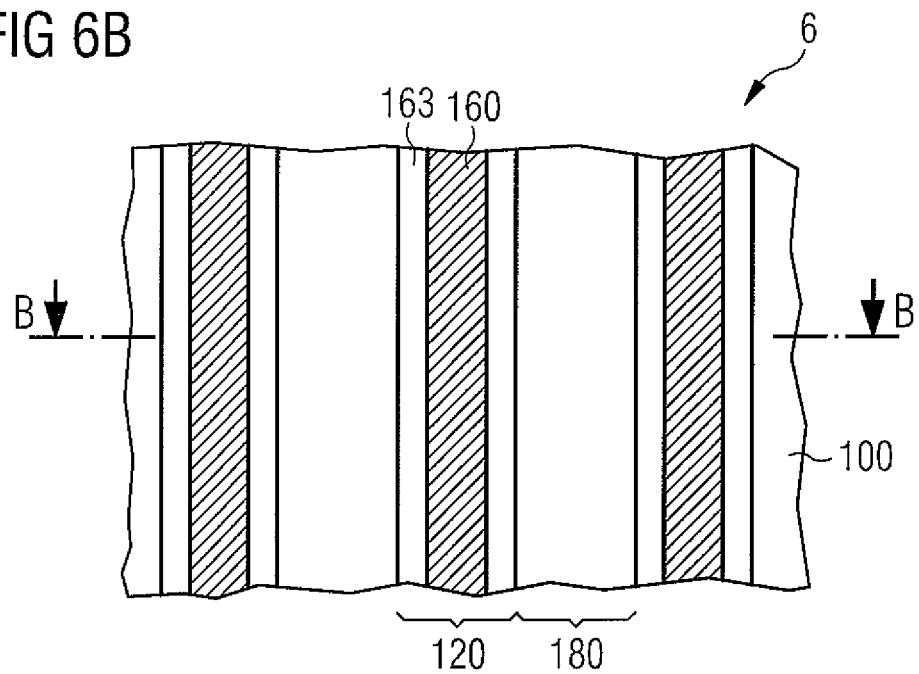
Figure 6C:
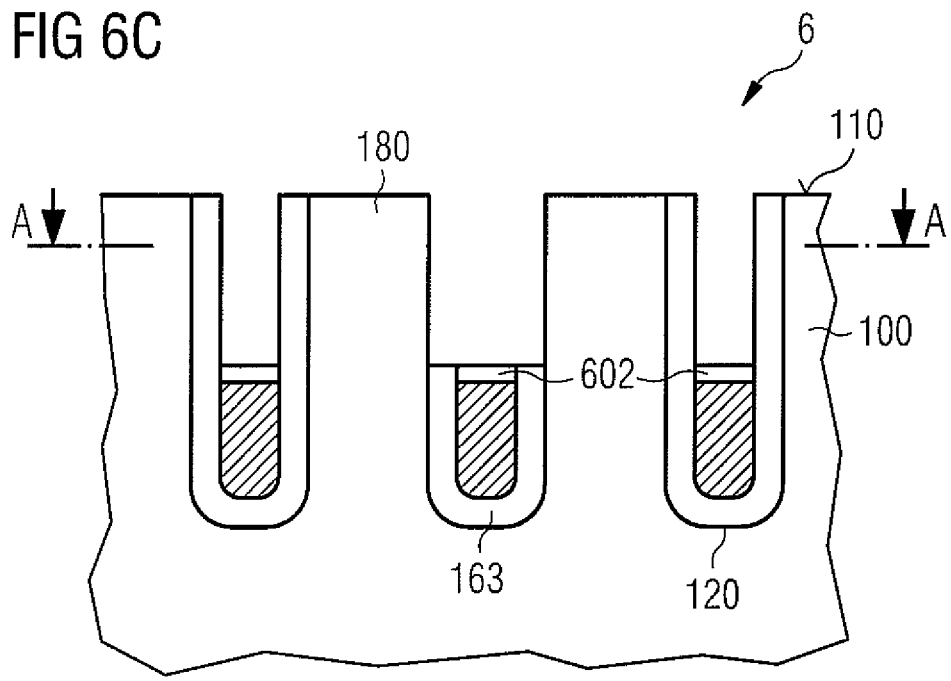
Figure 6D:
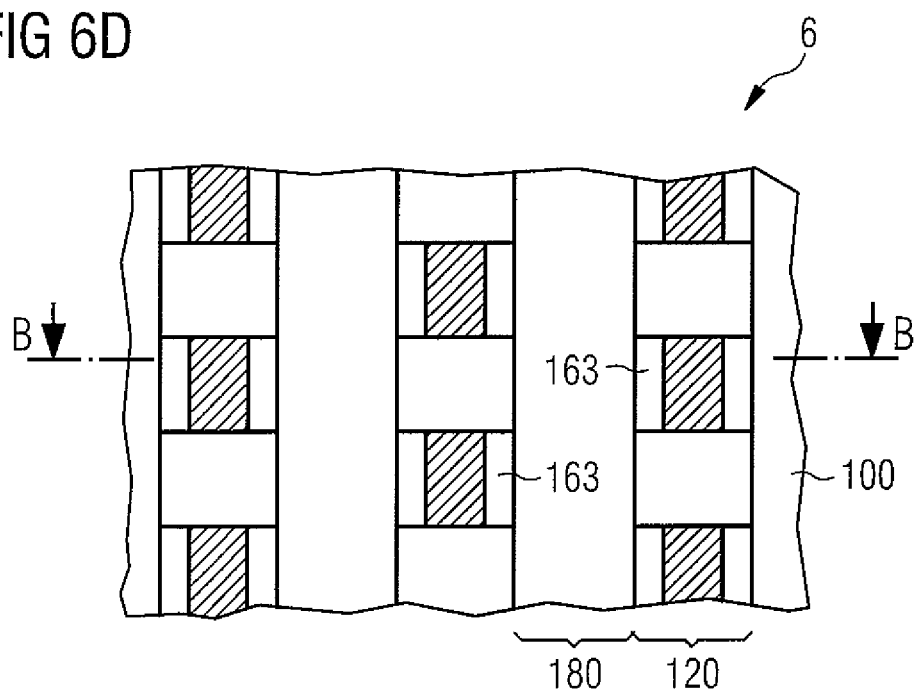

As is shown in FIG. 6A, the field plate 160 is filled in the trenches 120 and recessed. FIG. 6B shows a cross-sectional view parallel to the main surface 110 along the line A-A shown in FIG. 6A. Thereafter, an upper portion of the field dielectric layer 163 above the field plate 160 may be removed from selected portions of the trenches 120. Further, a cover layer 602 may be formed over the field plate 160. FIG. 6C shows an example of a resulting structure. The cross-sectional view of FIG. 6C is taken along the line B-B as shown in FIG. 6D.

Figure 6E:
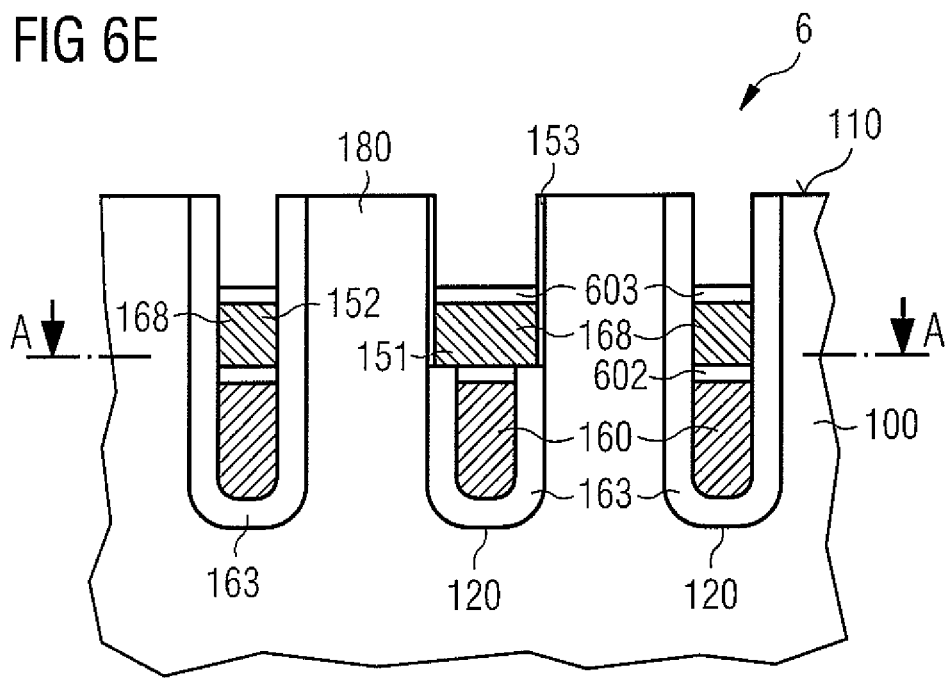
Figure 6F:
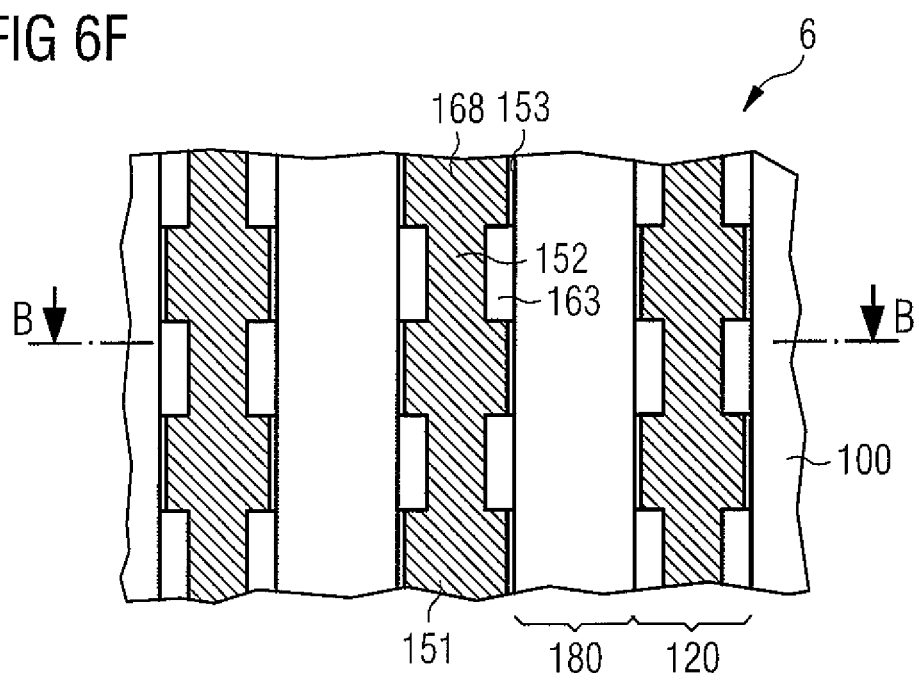

According to a further modification, the field plate 160 may be segmented in a manner as has been discussed before with reference to FIGS. 4 and 5. Thereafter, a thermal oxidation step may be performed to form the gate dielectric layer 153. Then, a gate conductive layer 168 may be formed in the upper trench portions. As a result, the field dielectric layer 163 is disposed between portions of the gate conductive material 168 and the adjacent semiconductor body 100, whereas a gate dielectric layer 153 is disposed between other portions of the gate conductive material 168 and the adjacent semiconductor body 100. Accordingly, the portions of the gate conductive layer 168 adjacent to the thin gate dielectric layer 153 form the gate segments 151, whereas the portions of the gate conductive layer 168 adjacent to the field dielectric layer 163 form the connection elements 152. FIG. 6E shows a cross-sectional view of a resulting structure. FIG. 6F shows a plan view of a resulting structure.

Figure 7:
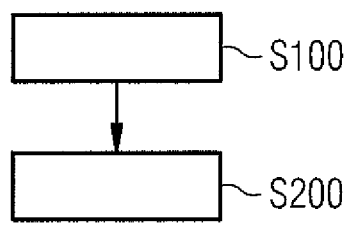
FIG. 7 summarizes a method of manufacturing a semiconductor device.

FIG. 7 summarizes the method according to an embodiment. As is shown in FIG. 7, a method of manufacturing a semiconductor device comprises forming (S100) a trench in a semiconductor body, forming (S200) a plurality of gate segments in the trench, the gate segments being electrically connected to neighboring gate segments by connection elements so as to be disposed along an extension direction of the trench, wherein a distance between neighboring gate segments is equal to or smaller than 0.5*l, wherein l denotes the length of each of the gate segments, the length being measured along the extension direction of the trench.

Figure 8:
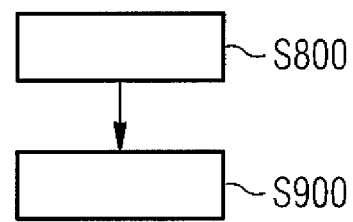
FIG. 8 summarizes a further method of manufacturing a semiconductor device.

FIG. 8 summarizes a further method according to an embodiment. As is illustrated, a method of manufacturing a semiconductor device including a transistor comprises forming (S800) a trench in a semiconductor body, and forming (S900) a plurality of field plate segments in the trench, the field plate segments being electrically connected to neighboring field plate segments by connection elements so as to be disposed along an extension direction of the trench.

Figure 9:
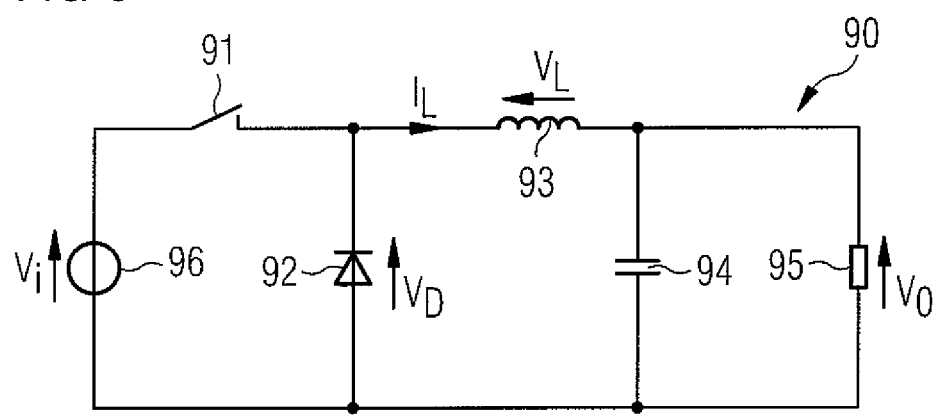
FIG. 9 illustrates an example of a converter circuit including the semiconductor device.

For example, the semiconductor device according to an embodiment may be a component of an electric circuit such as a buck converter. FIG. 9 shows an example of an equivalent circuit diagram of a buck converter 90 that may comprise the semiconductor device according to an embodiment. As is shown, a buck converter according to an embodiment may comprise a voltage supply 96, a switch 91, an inductor 93, a capacitance 94, a load 95, and a diode 92. The switch 91 may comprise the semiconductor device as described hereinabove. For example, the buck converter 90 may convert an input voltage of about 12 V to about 1 to 2 Volts at a frequency larger than 1 MHz. The buck converter 90 may for example be applied in devices such as power supplies, e.g. a switched mode power supply.

While embodiments of the invention have been described above, it is obvious that further embodiments may be implemented. For example, further embodiments may comprise any sub-combination of features recited in the claims or any sub-combination of elements described in the examples given above. Accordingly, this spirit and scope of the appended claims should not be limited to the description of the embodiments contained herein.

The invention claimed is:

1. A semiconductor device, comprising:
a gate electrode disposed in a trench formed in a semiconductor body;
a field plate comprising a plurality of field plate segments disposed in the trench below the gate electrode; and
a plurality of connection elements disposed in the trench below the gate electrode and electrically connecting neighboring ones of the field plate segments,
wherein the field plate segments extend deeper into the trench than the connection elements so that the field plate segments terminate closer to a bottom of the trench than the connection elements,
wherein in the trench below the plurality of connection elements, the field plate segments are separated from one another by a dielectric material along a lengthwise extension direction of the trench.

2. The semiconductor device of claim 1, wherein the gate electrode comprises a plurality of gate segments disposed and separated from each other along the lengthwise extension direction of the trench, the gate segments being electrically connected to neighboring ones of the gate segments by means of additional connection elements.

3. The semiconductor device of claim 2, wherein the gate segments have portions that do not overlap with the field plate segments in a vertical direction perpendicular to the lengthwise extension direction.

4. The semiconductor device of claim 2, wherein the connection elements are disposed directly beneath the additional connection elements, and wherein the field plate segments are disposed directly beneath the gate segments.

5. The semiconductor device of claim 1, further comprising a field dielectric layer between the field plate and the semiconductor body, wherein a distance $C_2$ between adjacent ones of the field plate segments corresponds to a thickness of the field dielectric layer, the distance $C_2$ being measured along the lengthwise extension direction of the trench.

6. The semiconductor device of claim 5, the distance $C_2$ between the field plate segments fulfills $0.5xt \leq C_2 \leq 1.5xt$, wherein t denotes the thickness of the field dielectric layer.

7. The semiconductor device of claim 6, wherein the length of the field plate segments is approximately equal to $C_2$.

8. The semiconductor device of claim 1, wherein the connection elements are implemented as segmented portions that are electrically connected to neighboring ones of the field plate segments.

9. The semiconductor device of claim 1, wherein the connection elements are implemented as a continuous line disposed over the field plate segments.

10. The semiconductor device of claim 9, wherein the field plate segments comprise a material different from a material of the connection elements and are separate from the connection elements.

11. The semiconductor device of claim 1, wherein the connection elements have a thickness that is smaller than a thickness of the field plate segments, wherein the thickness of the field plate segments and the thickness of the connection elements are measured in a depth direction of the semiconductor body.

12. The semiconductor device of claim 11, wherein a ratio of the thickness of the field plate segments to the thickness of the connection elements is 2 or more.

13. The semiconductor device of claim 1, wherein the field plate segments extend deeper in the semiconductor body than the connection elements.

14. The semiconductor device of claim 1, wherein the field plate segments are wider than the connection elements in a direction transvers to the lengthwise extension direction.

15. The semiconductor device of claim 1, wherein the connection elements are wider than the field plate segments in a direction transvers to the lengthwise extension direction.

16. The semiconductor device of claim 1, wherein the field plate segments comprise a different material than the connection elements and are separate from the connection elements.

17. The semiconductor device of claim 1, wherein the field plate segments and the connection elements comprise the same material.

18. The semiconductor device of claim 1, wherein the gate electrode is implemented as a continuous gate electrode.

19. A semiconductor device, comprising:
a semiconductor body having a first main surface;
a trench formed in the first main surface of the semiconductor body and having a lengthwise extension that runs parallel to the first main surface;
a plurality of columnar or needle shaped field plate segments disposed in the trench and separated from one another by a dielectric material along the lengthwise extension of the trench; and
a plurality of connection elements disposed in the trench above the plurality of field plate segments and electrically connecting neighboring ones of the field plate segments,
wherein the field plate segments extend deeper into the trench than the connection elements so that the field plate segments terminate closer to a bottom of the trench than the connection elements.

20. The semiconductor device of claim 19, wherein the field plate segments comprise a material different from a material of the connection elements.

21. The semiconductor device of claim 20, wherein the connection elements comprise metal and the field plate segments comprise doped polysilicon.

22. The semiconductor device of claim 20, wherein the connection elements comprise a TiN barrier layer and a tungsten filling.

23. The semiconductor device of claim 19, wherein the trench comprises first trench portions having a first width measured perpendicularly with respect to the lengthwise extension of the trench and second trench portions having a second width which is smaller than the first width, wherein the field plate segments are disposed in the first trench portions, and wherein the connection elements are disposed in the second trench portions.

24. The semiconductor device of claim 23, wherein the first trench portions extend deeper into the semiconductor body than the second trench portions.

* * * * *

UNITED STATES PATENT AND TRADEMARK OFFICE
CERTIFICATE OF CORRECTION

PATENT NO. : 10,181,511 B2
APPLICATION NO. : 14/871845
DATED : January 15, 2019
INVENTOR(S) : M. Poelzl et al.

Page 1 of 1

It is certified that error appears in the above-identified patent and that said Letters Patent is hereby corrected as shown below:

In the Claims

Column 13, Line 51, Claim 6, Line 1, change "claim 5, the" to -- claim 5, wherein the --.

Signed and Sealed this
Second Day of April, 2019

Andrei Iancu
*Director of the United States Patent and Trademark Office*